US009287110B2

(12) United States Patent
Thie et al.

(10) Patent No.: US 9,287,110 B2
(45) Date of Patent: Mar. 15, 2016

(54) METHOD AND APPARATUS FOR WAFER ELECTROLESS PLATING

(71) Applicant: Lam Research Corporation, Fremont, CA (US)

(72) Inventors: William Thie, Mountain View, CA (US); John M. Boyd, Woodlawn, CA (US); Fritz C. Redeker, Fremont, CA (US); Yezdi Dordi, Palo Alto, CA (US); John Parks, Hercules, CA (US); Tiruchirapalli Arunagiri, Fremont, CA (US); Aleksander Owczarz, San Jose, CA (US); Todd Balisky, Corona, CA (US); Clint Thomas, Milpitas, CA (US); Jacob Wylie, Fremont, CA (US); Alan M. Schoepp, Ben Lomond, CA (US)

(73) Assignee: Lam Research Corporation, Fremont, CA (US)

( * ) Notice: Subject to any disclaimer, the term of this patent is extended or adjusted under 35 U.S.C. 154(b) by 108 days.

(21) Appl. No.: 13/918,616

(22) Filed: Jun. 14, 2013

(65) Prior Publication Data
US 2013/0280917 A1 Oct. 24, 2013

Related U.S. Application Data

(62) Division of application No. 11/735,987, filed on Apr. 16, 2007, now Pat. No. 8,485,120.

(51) Int. Cl.
B05C 11/00 (2006.01)
B05D 1/28 (2006.01)
(Continued)

(52) U.S. Cl.
CPC ...... H01L 21/02104 (2013.01); C23C 18/1619 (2013.01); H01L 21/67005 (2013.01); H01L 21/6715 (2013.01)

(58) Field of Classification Search
CPC .................. C23C 18/1619; H01L 21/6715
USPC ............... 427/304, 305, 306, 97.9, 99.5, 437, 427/443.1; 438/678
See application file for complete search history.

(56) References Cited

U.S. PATENT DOCUMENTS

| 2,941,902 A | 6/1960 | Talmey et al. |
| 3,931,790 A | 1/1976 | Franz |

(Continued)

FOREIGN PATENT DOCUMENTS

| EP | 01061157 | 12/2000 |
| EP | 1243672 | 9/2002 |

(Continued)

*Primary Examiner* — Dah-Wei D Yuan
*Assistant Examiner* — Nga Leung V Law
(74) *Attorney, Agent, or Firm* — Martine Penilla Group, LLP

(57) ABSTRACT

A semiconductor wafer electroless plating apparatus includes a platen and a fluid bowl. The platen has a top surface defined to support a wafer, and an outer surface extending downward from a periphery of the top surface to a lower surface of the platen. The fluid bowl has an inner volume defined by an interior surface so as to receive the platen, and wafer to be supported thereon, within the inner volume. A seal is disposed around the interior surface of the fluid bowl so as to form a liquid tight barrier when engaged between the interior surface of the fluid bowl and the outer surface of the platen. A number of fluid dispense nozzles are positioned to dispense electroplating solution within the fluid bowl above the seal so as to rise up and flow over the platen, thereby flowing over the wafer when present on the platen.

20 Claims, 13 Drawing Sheets

(51) Int. Cl.
*H01L 21/02* (2006.01)
*C23C 18/16* (2006.01)
*H01L 21/67* (2006.01)

(56) References Cited

U.S. PATENT DOCUMENTS

| | | | |
|---|---|---|---|
| 4,239,732 A | 12/1980 | Schneider | |
| 4,887,411 A | 12/1989 | Rondeau et al. | |
| 5,857,589 A | 1/1999 | Cline et al. | |
| 5,918,976 A | 7/1999 | Hashimoto et al. | |
| 6,060,176 A | 5/2000 | Semkow et al. | 428/620 |
| 6,171,367 B1 | 1/2001 | Peng et al. | |
| 6,200,414 B1 | 3/2001 | Hwang et al. | |
| 6,247,479 B1 | 6/2001 | Taniyama et al. | |
| 6,258,223 B1 * | 7/2001 | Cheung | H01L 21/68721 204/242 |
| 6,335,104 B1 | 1/2002 | Sambucetti et al. | 428/615 |
| 6,889,627 B1 | 5/2005 | Hao | |
| 6,926,817 B2 | 8/2005 | Marumo et al. | |
| 2002/0166575 A1 | 11/2002 | Marumo et al. | |
| 2003/0073845 A1 | 4/2003 | Barta et al. | |
| 2003/0113576 A1 | 6/2003 | Chebiam et al. | 428/670 |
| 2003/0118732 A1 | 6/2003 | Stevens et al. | |
| 2003/0181040 A1 | 9/2003 | Ivanov et al. | |
| 2003/0200926 A1 | 10/2003 | Dando et al. | |
| 2004/0016637 A1 | 1/2004 | Yang et al. | |
| 2004/0035316 A1 | 2/2004 | Chebiam et al. | 106/1.22 |
| 2004/0038073 A1 | 2/2004 | Chebiam et al. | 428/668 |
| 2004/0045502 A1 | 3/2004 | Yokoyama et al. | |
| 2004/0057334 A1 | 3/2004 | Wilmer et al. | |
| 2004/0083978 A1 | 5/2004 | Welch et al. | |
| 2004/0154535 A1 | 8/2004 | Chen et al. | |
| 2004/0182422 A1 | 9/2004 | Boyd et al. | |
| 2004/0198190 A1 | 10/2004 | Basol et al. | |
| 2004/0235237 A1 | 11/2004 | Inoue et al. | 438/232 |
| 2005/0051093 A1 | 3/2005 | Makino et al. | |
| 2005/0051437 A1 | 3/2005 | Kurashina et al. | |
| 2005/0081785 A1 | 4/2005 | Lubomirsky et al. | |
| 2005/0160990 A1 | 7/2005 | Lubomirsky et al. | |
| 2005/0163916 A1 | 7/2005 | Dubin et al. | |
| 2005/0181135 A1 * | 8/2005 | Ivanov | H01L 21/67051 427/305 |
| 2005/0181226 A1 | 8/2005 | Weidman et al. | |
| 2006/0037858 A1 | 2/2006 | Marumo et al. | 204/297.07 |
| 2006/0081461 A1 | 4/2006 | Jomen et al. | |

FOREIGN PATENT DOCUMENTS

| | | | |
|---|---|---|---|
| JP | S57-41363 | 3/1982 | |
| JP | 11-092949 | 4/1999 | |
| JP | 2000064087 | 2/2000 | |
| JP | 2000319797 | 11/2000 | |
| JP | 2001073157 | 3/2001 | C23C 18/18 |
| JP | 2001-192845 | 7/2001 | C23C 18/16 |
| JP | 2001192845 A * | 7/2001 | |
| JP | 2001316834 | 11/2001 | |
| JP | 2001-342573 | 12/2001 | C23C 18/16 |
| JP | 2002-129344 | 5/2002 | C23C 18/16 |
| JP | 2002-367998 | 12/2002 | H01L 21/3205 |
| JP | 2004084020 | 3/2004 | C23C 18/31 |
| JP | 2005068494 | 3/2005 | C23C 18/16 |
| JP | 2006-501360 | 1/2006 | C23C 18/16 |
| KR | 10-2005-0057334 | 6/2005 | |
| TW | 478056 | 3/2002 | |
| TW | 527633 | 4/2003 | |
| TW | I247056 | 1/2006 | |
| TW | I251511 | 3/2006 | |
| TW | I278358 | 4/2007 | |
| WO | WO 0148800 | 7/2001 | |
| WO | WO2005073429 A2 | 8/2005 | C23C 18/16 |

\* cited by examiner ized as U.S. Pat. No. 8,069,813, on Dec. 6, 2011, and U.S. patent
METHOD AND APPARATUS FOR WAFER ELECTROLESS PLATING

CLAIM OF PRIORITY

This application is a divisional application of U.S. patent application Ser. No. 11/735,987, filed on Apr. 16, 2007, entitled "Method and Apparatus for Wafer Electroless Plating." The above-identified patent applications is incorporated herein by reference in its entirety.

CROSS REFERENCE TO RELATED APPLICATIONS

This application is related to U.S. patent application Ser. No. 11/735,984, filed on Apr. 16, 2007, entitled "Wafer Electroless Plating System and Associated Methods," issued as U.S. Pat. No. 8,069,813, on Dec. 6, 2011, and U.S. patent application Ser. No. 11/735,989, filed on Apr. 16, 2007, entitled "Fluid Handling System for Wafer Electroless Plating and Associated Methods," and U.S. patent application Ser. No. 11/639,752, filed on Dec. 15, 2006, entitled "Controlled Ambient System for Interface Engineering," and U.S. Pat. No. 7,045,018, entitled "Substrate Brush Scrubbing and Proximity Cleaning-Drying Sequence Using Compatible Chemistries, and Method, Apparatus, and System for Implementing the Same," and U.S. patent application Ser. No. 11/016,381, filed on Dec. 16, 2004, entitled "System Method and Apparatus for Dry-in, Dry-out Low Defect Laser Dicing Using Proximity Technology," issued as U.S. Pat. No. 7,675,000, on Mar. 9, 2010, and U.S. patent application Ser. No. 10/882,716, filed on Jun. 30, 2004, entitled "Proximity Substrate Preparation Sequence, and Method, Apparatus, and System for Implementing the Same," issued as U.S. Pat. No. 8,236,382, on Aug. 7, 2012, and U.S. patent application Ser. No. 11/382,906, filed on May 11, 2006, entitled "Plating Solution for Electroless Deposition of Copper," issued as U.S. Pat. No. 7,306,662, on Dec. 11, 2007, and U.S. patent application Ser. No. 11/427,266, filed on Jun. 28, 2006, entitled "Plating Solutions for Electroless Deposition of Copper," issued as U.S. Pat. No. 7,297,190, on Nov. 20, 2007, and U.S. patent application Ser. No. 11/639,012, filed on Dec. 13, 2006, entitled "Self Assembled Monolayer for Improving Adhesion Between Copper and Tantalum," and U.S. patent application Ser. No. 11/591,310, filed on Oct. 31, 2006, entitled "Methods of Fabricating a Barrier Layer with Varying Composition for Copper Metallization," issued as U.S. Pat. No. 7,863,179, on Jan. 4, 2011, and U.S. patent application Ser. No. 11/552,794, filed on Oct. 25, 2006, entitled "Apparatus and Method for Substrate Electroless Plating," issued as U.S. Pat. No. 7,874,260, on Jan. 25, 2011, and U.S. Pat. No. 7,153,400, entitled "Apparatus and Method for Depositing and Planarizing Thin Films of Semiconductor Wafers," and U.S. patent application Ser. No. 11/539,155, filed on Oct. 5, 2006, entitled "Electroless Plating Method and Apparatus," issued as U.S. Pat. No. 7,829,152, on Nov. 9, 2010, and U.S. patent application Ser. No. 11/611,758, filed on Dec. 15, 2006, entitled "Method for Gap Fill in Controlled Ambient System." The disclosure of each of the above-identified related applications is incorporated herein by reference.

BACKGROUND OF THE INVENTION

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

To build an integrated circuit, transistors are first created on the surface of the wafer. The wiring and insulating structures are then added as multiple thin-film layers through a series of manufacturing process steps. Typically, a first layer of dielectric (insulating) material is deposited on top of the formed transistors. Subsequent layers of metal (e.g., copper, aluminum, etc.) are formed on top of this base layer, etched to create the conductive lines that carry the electricity, and then filled with dielectric material to create the necessary insulators between the lines.

Although copper lines are typically comprised of a PVD seed layer (PVD Cu) followed by an electroplated layer (ECP Cu), electroless chemistries are under consideration for use as a PVD Cu replacement, and even as a ECP Cu replacement. Electroless copper (Cu) and electroless cobalt (Co) are potential techniques for improving interconnect reliability and performance. Electroless Cu can be used to form a thin conformal seed layer on a conformal barrier to optimize a gapfill process and minimize void formation. Further, deposition of a selective Co capping layer on planarized Cu lines can improve adhesion of the dielectric barrier layer to the Cu lines, and suppress void formation and propagation at the Cu-dielectric barrier interface.

During the electroless plating process, electrons are transferred from a reducing agent to the Cu (or Co) ions in the solution resulting in the deposition of reduced Cu (or Co) onto the wafer surface. The formulation of the electroless copper plating solution is optimized to maximize the electron transfer process involving the Cu (or Co) ions in solution. The plating thickness achieved through the electroless plating process is dependent on the residency time of the electroless plating solution on the wafer. Because the electroless plating reactions occur immediately and continuously upon exposure of the wafer to the electroless plating solution, it is desirable to perform the electroless plating process in a controlled manner and under controlled conditions. To this end, a need exists for an improved electroless plating apparatus.

SUMMARY OF THE INVENTION

In one embodiment, a semiconductor wafer electroless plating apparatus is disclosed. The apparatus includes a platen having a top surface defined to support a wafer. The platen also includes an outer surface extending downward from a periphery of the top surface of the platen to a lower surface of the platen. The apparatus also includes a fluid bowl having an inner volume defined by an interior surface. The fluid bowl is configured to receive the platen and wafer to be supported thereon within its inner volume. A seal is disposed around the interior surface of the fluid bowl so as to form a liquid tight barrier when engaged between the interior surface of the fluid bowl and the outer surface of the platen. Additionally, a number of fluid dispense nozzles are positioned to dispense electroplating solution within the fluid bowl at a number of respective locations above the seal.

In another embodiment, a system for semiconductor wafer electroless plating is disclosed. The system includes a platen defined to have an upper surface for supporting a wafer and an outer surface extending downward from the upper surface. The system also includes a fluid bowl defined to receive the platen and wafer to be supported thereon, so as to form a liquid retaining volume between an inner surface of the fluid bowl and the outer surface of the platen. A number of fluid dispense nozzles are also defined to dispense fluid within the liquid retaining volume at locations below the upper surface of the platen. The system further includes a fluid handling system in fluid communication with the number of fluid dispense nozzles. The fluid handling system is defined to flow an electroless plating solution to and through the number of fluid dispense nozzles, so as to fill the liquid retaining volume with the electroless plating solution and cause the electroless plating solution to rise up and flow over the platen, so as to flow over a wafer to be supported on the upper surface of the platen.

In another embodiment, a method is disclosed for semiconductor wafer electroless plating. In the method, a wafer is supported on a platen. Also, an electroless plating solution is dispensed within a liquid retaining volume defined around the platen and at a location below the wafer. The electroless plating solution is dispensed to fill the liquid retaining volume and rise up and flow over a top surface of the wafer in a substantially uniform manner extending inward from a periphery of the top surface of the wafer to a center of the top surface of the wafer. The method also includes an operation for draining the electroless plating solution from the liquid retaining volume so as to remove most of the electroless plating solution from the top surface of the wafer. The top surface of the wafer is rinsed immediately upon draining the electroless plating solution from the liquid retaining volume.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
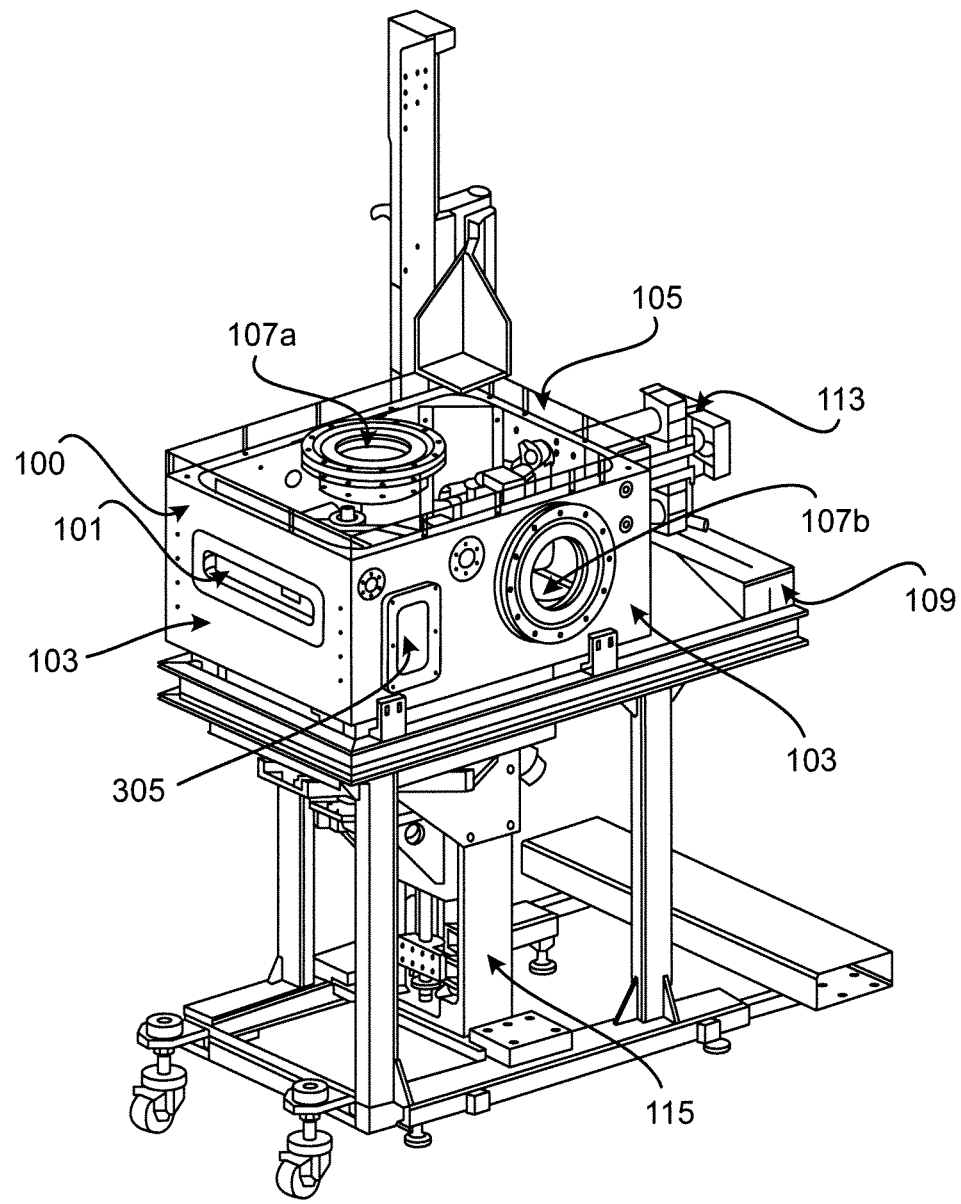
FIG. 1 is an illustration showing an isometric view of a dry-in/dry-out electroless plating chamber, in accordance with one embodiment of the present invention.

FIG. 1 is an illustration showing an isometric view of a dry-in/dry-out electroless plating chamber 100 ("chamber 100" hereafter), in accordance with one embodiment of the present invention. The chamber 100 is defined to receive a wafer in a dry state, perform an electroless plating process on the wafer, perform a rinsing process on the wafer, perform a drying process on the wafer, and provide the processed wafer in a dry state. The chamber 100 is capable of performing essentially any type of electroless plating process. For example, the chamber 100 is capable of performing an electroless Cu or Co plating process on the wafer. Additionally, the chamber 100 is configured to be integrated within a modular wafer processing system. For example, in one embodiment, the chamber 100 is connected with a managed atmospheric transfer module (MTM). For additional information regarding the MTM, reference can be made to U.S. patent application Ser. No. 11/639,752, filed on Dec. 15, 2006, and entitled "Controlled Ambient System for Interface Engineering," which is incorporated herein by reference.

For more information on electroless plating, reference can be made to: (1) U.S. patent application Ser. No. 11/382,906, filed on May 11, 2006, entitled "Plating Solution for Electroless Deposition of Copper," (2) U.S. patent application Ser. No. 11/427,266, filed on Jun. 28, 2006, entitled "Plating Solutions for Electroless Deposition of Copper," (3) U.S. patent application Ser. No. 11/639,012, filed on Dec. 13, 2006, entitled "Self Assembled Monolayer for Improving Adhesion Between Copper and Tantalum," (4) U.S. patent application Ser. No. 11/591,310, filed on Oct. 31, 2006, entitled "Methods of Fabricating a Barrier Layer with Varying Composition for Copper Metallization," (5) U.S. patent application Ser. No. 11/552,794, filed on Oct. 25, 2006, entitled "Apparatus and Method for Substrate Electroless Plating," (6) U.S. Pat. No. 7,153,400, entitled "Apparatus and Method for Depositing and Planarizing Thin Films of Semiconductor Wafers," (7) U.S. patent application Ser. No. 11/539,155, filed on Oct. 5, 2006, entitled "Electroless Plating Method and Apparatus," and (8) U.S. patent application Ser. No. 11/611,758, filed on Dec. 15, 2006, entitled "Method for Gap Fill in Controlled Ambient System," each of which is incorporated herein by reference.

The chamber 100 is equipped to receive a wafer in a dry state from an interfacing module, such as the MTM. The chamber 100 is equipped to perform an electroless plating process on the wafer within the chamber 100. The chamber 100 is defined to perform a drying process on the wafer within the chamber 100. The chamber 100 is defined to provide the wafer in a dry state back to the interfacing module. It should be appreciated that the chamber 100 is defined to perform the electroless plating process and the drying process on the wafer within a common internal volume of the chamber 100. Additionally, a fluid handling system (FHS) is provided to support the wafer electroless plating process and the wafer drying process within the common internal volume of the chamber 100.

The chamber 100 includes a first wafer processing zone defined within an upper region of an internal volume of the chamber 100. The first wafer processing zone is equipped to perform the drying process on the wafer when disposed within the first wafer processing zone. The chamber 100 also includes a second wafer processing zone defined within a lower region of the internal volume of the chamber 100. The second wafer processing zone is equipped to perform the electroless plating process on the wafer when disposed within the second wafer processing zone. Additionally, the chamber 100 includes a platen that is vertically movable between the first and second wafer processing zones within the internal volume of the chamber 100. The platen is defined to transport the wafer between the first and second processing zones and support the wafer within the second processing zone during the electroless plating process.

With regard to FIG. 1, the chamber 100 is defined by outer structure walls 103 including an outer structural bottom and a structural top 105. The outer structure of the chamber 100 is capable of resisting forces associated with a sub-atmospheric pressure, i.e., vacuum, condition within the internal volume of the chamber 100. The outer structure of the chamber 100 is also capable of resisting forces associated with an above-atmospheric pressure condition within the internal volume of the chamber 100. In one embodiment, the structural top 105 of the chamber is equipped with a window 107A. Additionally, in one embodiment a window 107B is provided in an outer structural wall 103 of the chamber. It should be understood, however, that the windows 107A and 107B are not critical to the operation of the chamber 100. For example, in one embodiment, the chamber 100 is defined without windows 107A and 107B.

The chamber 100 is defined to sit atop a frame assembly 109. It should be understood that other embodiments may utilize a frame assembly that is different from the exemplary frame assembly 109 depicted in FIG. 1. The chamber 100 is defined to include an entry door 101 through which a wafer is inserted into and removed from the chamber 100. The chamber 100 further includes a stabilizer assembly 305, a platen lift assembly 115, and a proximity head drive mechanism 113, each of which will be described in more detail below.

Figure 2:
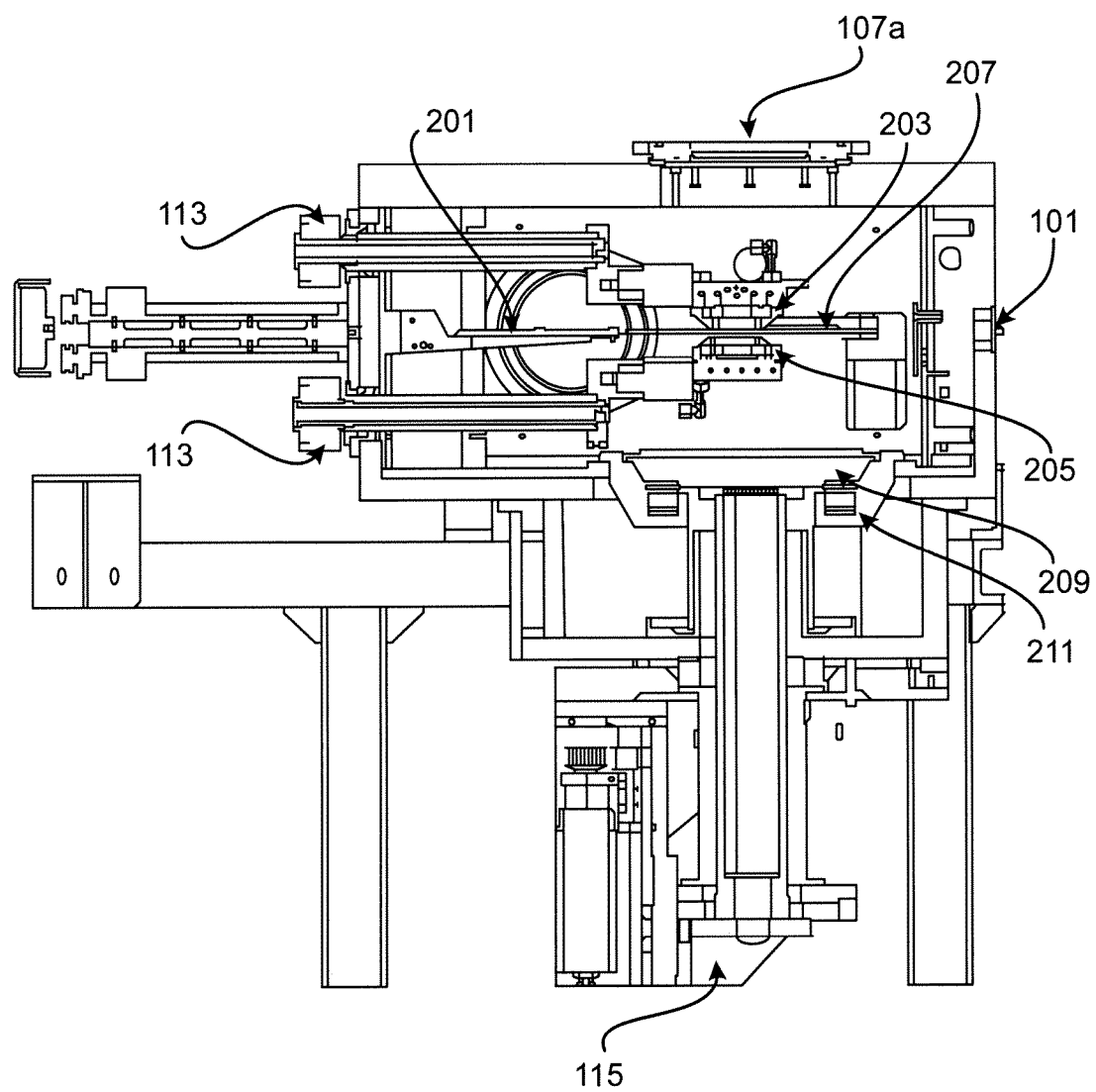
FIG. 2 is an illustration showing a vertical cross-section through a center of the chamber, in accordance with one embodiment of the present invention.

FIG. 2 is an illustration showing a vertical cross-section through a center of the chamber 100, in accordance with one embodiment of the present invention. The chamber 100 is defined such that when a wafer 207 is inserted through the entry door 101, the wafer 207 will be engaged by a drive roller assembly 303 (not shown) and the stabilizer assembly 305 within the upper region of the chamber internal volume. By way of the platen lift assembly 115, a platen 209 is defined to travel in a vertical direction between the upper and lower regions of the chamber internal volume. The platen 209 is defined to receive the wafer 207 from the drive roller assembly 303 and stabilizer assembly 305, and move the wafer 207 to the second wafer processing zone in the lower region of the chamber internal volume. As will be described in more detail below, within the lower region of the chamber, the platen 209 is defined to interface with a fluid bowl 211 to enable the electroless plating process.

Following the electroless plating process within the lower region of the chamber, the wafer 207 is lifted via the platen 209 and platen lift assembly 115 back to the position where it can be engaged by the drive roller assembly 303 and the stabilizer assembly 305. Once securely engaged by the drive roller assembly 303 and the stabilizer assembly 305, the platen 209 is lowered to a position within the lower region of the chamber 100. The wafer 207, having been subjected to the electroless plating process, is then dried by way of an upper proximity ("prox" hereafter) head 203 and a lower prox head 205. The upper prox head 203 is defined to dry an upper surface of the wafer 207. The lower prox head is defined to dry a lower surface of the wafer 207.

By way of the prox head drive mechanism 113, the upper and lower prox heads 203/205 are defined to move in a linear manner across the wafer 207 when the wafer 207 is engaged by the drive roller assembly 303 and the stabilizer assembly 305. In one embodiment, the upper and lower prox heads 203/205 are defined to move to a center of the wafer 207 as the wafer 207 is rotated by the drive roller assembly 303. In this manner, the wafer 207 upper and lower surfaces can be completely exposed to the upper and lower prox heads 203/205, respectively. The chamber 100 further includes a prox head docking station 201 for receiving each of the upper and lower prox heads 203/205 when retracted to their home position. The prox head docking station 201 also provides for a smooth transition of the meniscus associated with each of the upper and lower prox heads 203/205 as the meniscus transitions onto the wafer 207. The prox head docking station 201 is positioned within the chamber so as to ensure that when the upper and lower prox heads 203/205 are retracted to their respective home positions, the upper and lower prox heads 203/205 do not interfere with the drive roller assembly 303, the stabilizer assembly 305, or the platen 209 when raised to receive the wafer 207.

Figure 3:
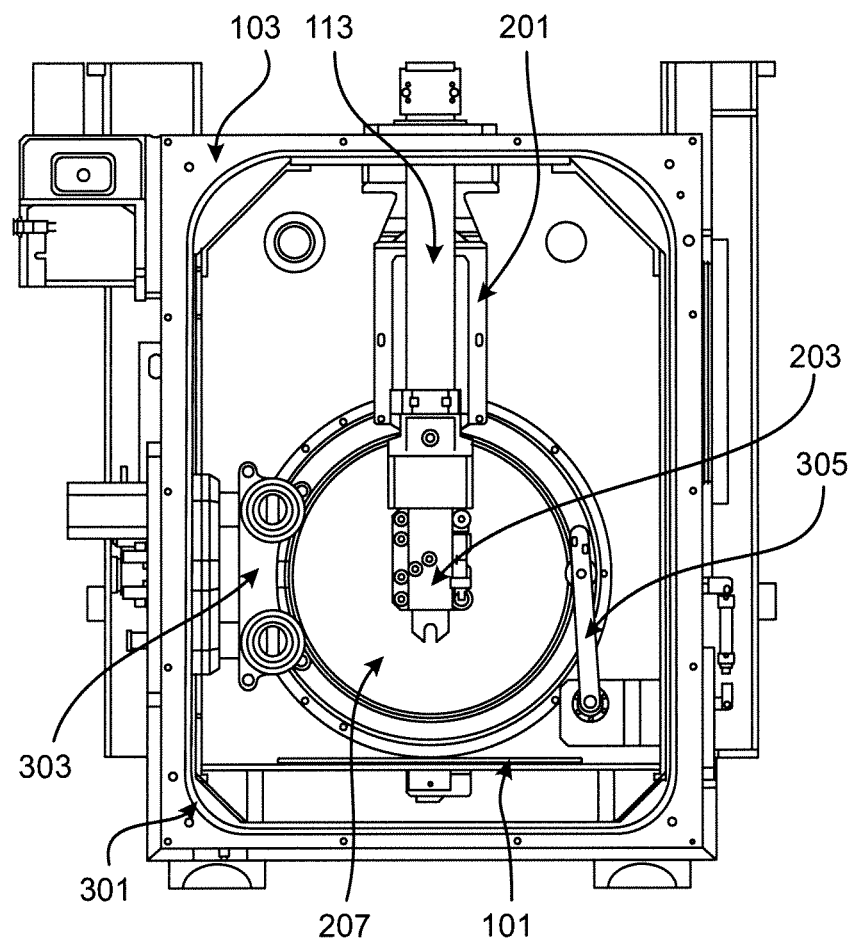
FIG. 3 is an illustration showing a top view of the chamber with the upper prox head extended to the center of the wafer, in accordance with one embodiment of the present invention.
Figure 4:
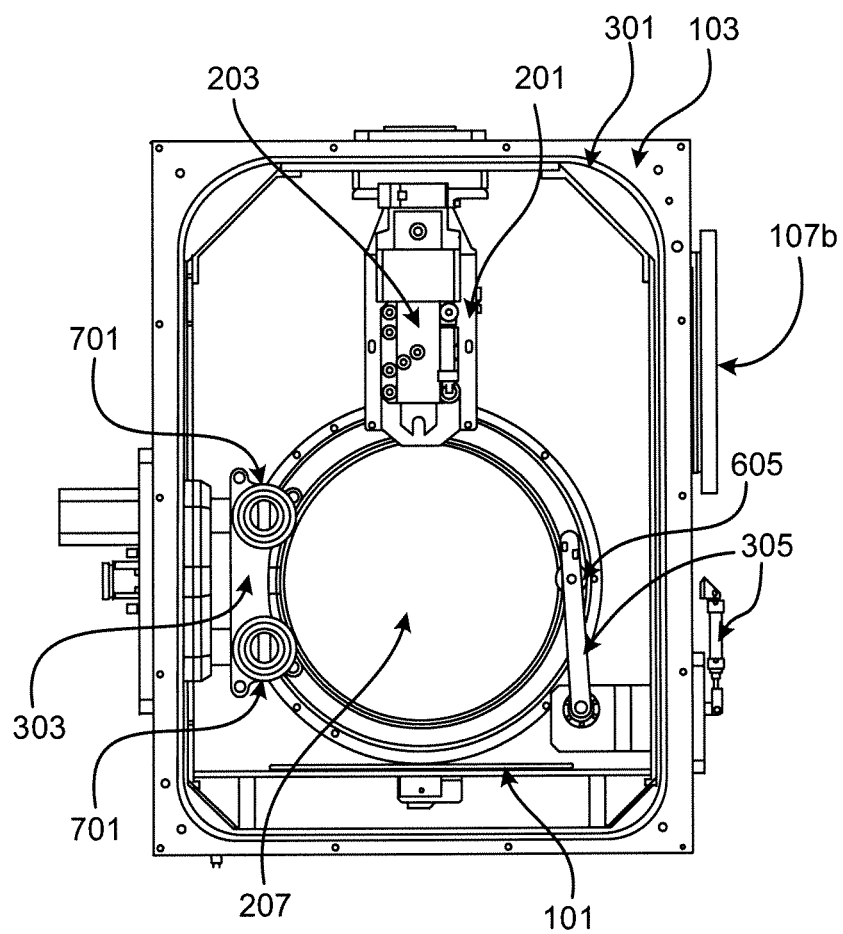
FIG. 4 is an illustration showing a top view of the chamber with the upper prox head retracted to the home position over the prox head docking station, in accordance with one embodiment of the present invention.

FIG. 3 is an illustration showing a top view of the chamber with the upper prox head 203 extended to the center of the wafer 207, in accordance with one embodiment of the present invention. FIG. 4 is an illustration showing a top view of the chamber with the upper prox head 203 retracted to the home position over the prox head docking station 201, in accordance with one embodiment of the present invention. As previously mentioned, when the wafer 207 is received within the chamber 100 through the entry door 101, the wafer is engaged and held by the drive roller assembly 303 and the stabilizer assembly 305. By way of the prox head drive mechanism 113, the upper prox head 203 can be moved in a linear manner from its home position on the prox head docking station 201 to the center of the wafer 207. Similarly, by way of the prox head drive mechanism 113, the lower prox head 205 can be moved in a linear manner from its home position on the prox head docking station 201 to the center of the wafer 207. In one embodiment, the prox head drive mechanism 113 is defined to move the upper and lower prox heads 203/205 together from the prox head docking station 201 to the center of the wafer 207.

As shown in FIG. 3, the chamber 100 is defined by the outer structural walls 103 and an inner liner 301. Thus, the chamber 100 incorporates a double-wall system. The outer structural walls 103 have sufficient strength to provide a vacuum capability within the chamber 100 and thereby form a vacuum boundary. In one embodiment, the outer structural walls 103 are formed of a structural metal such as stainless steel. It should be understood, however, that essentially any other structural material having appropriate strength characteristics can be used to form the outer structural walls 103. The outer structural walls 103 are also defined with sufficient precision to enable interfacing of the chamber 100 with another module, such as the MTM.

The inner liner 301 provides a chemical boundary and acts as a separator to keep chemicals within the chamber from reaching the outer structural walls 103. The inner liner 301 is formed of an inert material that is chemically compatible with the various chemicals that may be present within the chamber 100. In one embodiment, the inner liner 301 is formed of an inert plastic material. It should be understood, however, that essentially any other chemically inert material that can be appropriately shaped can be used to form the inner liner 301. It should also be understood that the inner liner 301 is not required to provide a vacuum boundary. As previously mentioned, the outer structural walls 103 are defined to provide the vacuum boundary. Additionally, in one embodiment, the inner liner 301 can be removed from the chamber 100 to facilitate cleaning or to simply be replaced with a new inner liner 301.

The chamber 100 is defined to be ambient controlled to facilitate the wafer electroless plating process and protect the wafer surface from undesirable reactions, e.g., oxidation. To this end, the chamber 100 is equipped with an internal pressure control system and an internal oxygen content control system. In one embodiment, the chamber 100 is capable of being pumped down to a pressure of less than 100 mTorr. In one embodiment, it is anticipated that the chamber 100 will be operated at approximately 700 Torr.

It should be appreciated that the oxygen concentration within the chamber 100 internal volume is an important process parameter. More specifically, a low oxygen concentration is required in the wafer processing environment to ensure that undesirable oxidation reactions are avoided at the wafer surface. It is anticipated that the oxygen concentration within the chamber 100 internal volume will be maintained at a level less than 2 ppm (parts per million) when the wafer is present within the chamber 100. The oxygen concentration within the chamber 100 is reduced by evacuating the chamber, by way of a vacuum source plumbed to the internal volume of the chamber 100, and refilling the chamber 100 internal volume with high purity nitrogen. Therefore, the oxygen concentration within the chamber 100 internal volume is reduced from atmospheric levels, i.e., about 20% oxygen, by pumping the chamber 100 internal volume down to a low pressure and refilling the chamber 100 internal volume with ultra pure nitrogen which has a negligible oxygen content. In one embodiment, pumping the chamber 100 internal volume down to 1 Torr and refilling it to atmospheric pressure with ultra pure nitrogen three times should bring the oxygen concentration within the chamber 100 internal volume down to about 3 ppm.

The electroless plating process is a temperature sensitive process. Therefore, it is desirable to minimize the influence of the chamber 100 internal volume ambient conditions on the temperature of the electroless plating solution when present on the wafer surface. To this end, the chamber 100 is defined such that gases can be introduced into the chamber 100 internal volume through air gaps present between the outer structural walls 103 and the inner liner 301, so as to avoid flowing of gases directly over the wafer. It should be appreciated that a flow of gas directly over the wafer when electroless plating solution is present on the wafer surface could cause an evaporative cooling effect that would reduce the temperature of the electroless plating solution present on the wafer, and correspondingly modify the electroless plating reaction rate. In addition to the capability of indirectly introducing gas into the chamber 100 internal volume, the chamber 100 is also equipped to allow a vapor pressure within the chamber 100 internal volume to be raised to a saturated state when the electroless plating solution is applied over the wafer surface. With the chamber 100 internal volume in a saturated state relative to the electroless plating solution, the above-mentioned evaporative cooling effect would be minimized.

With reference back to FIGS. 3 and 4, the stabilizer assembly 305 includes a stabilizer roller 605 that is defined to apply pressure to the edge of the wafer 207 so as to hold the wafer 207 in the drive roller assembly 303. Thus, the stabilizer roller 605 is defined to engage the edge of the wafer 207. The stabilizer roller 605 profile is defined to accommodate an amount of angular misalignment between the stabilizer roller 605 and the wafer 207. Also, the stabilizer assembly 305 is defined to enable mechanical adjustment of the stabilizer roller 605 vertical position. The stabilizer assembly 305 shown in FIG. 6 includes a single stabilizer roller 605 to accommodate a 200 mm wafer. In another embodiment, the stabilizer assembly 305 can be defined with two stabilizer rollers 605 to accommodate a 300 mm wafer.

Also with reference back to FIGS. 3 and 4, the drive roller assembly 303 includes a pair of drive rollers 701 defined to engage the edge of the wafer 207 and rotate the wafer 207. Each of the drive rollers 701 is defined to engage the edge of the wafer 207. The profile of each drive roller 701 is defined to accommodate an amount of angular misalignment between the drive roller 701 and the wafer 207. Also, the drive roller assembly 303 is defined to enable mechanical adjustment of the vertical position of each drive roller 701. The drive roller assembly 303 is capable of moving the drive rollers 701 toward and away from the edge of the wafer 207. Engagement of the stabilizer roller 605 with the edge of the wafer 207 will cause the drive rollers 701 to engage the edge of the wafer 207.

Figure 5:
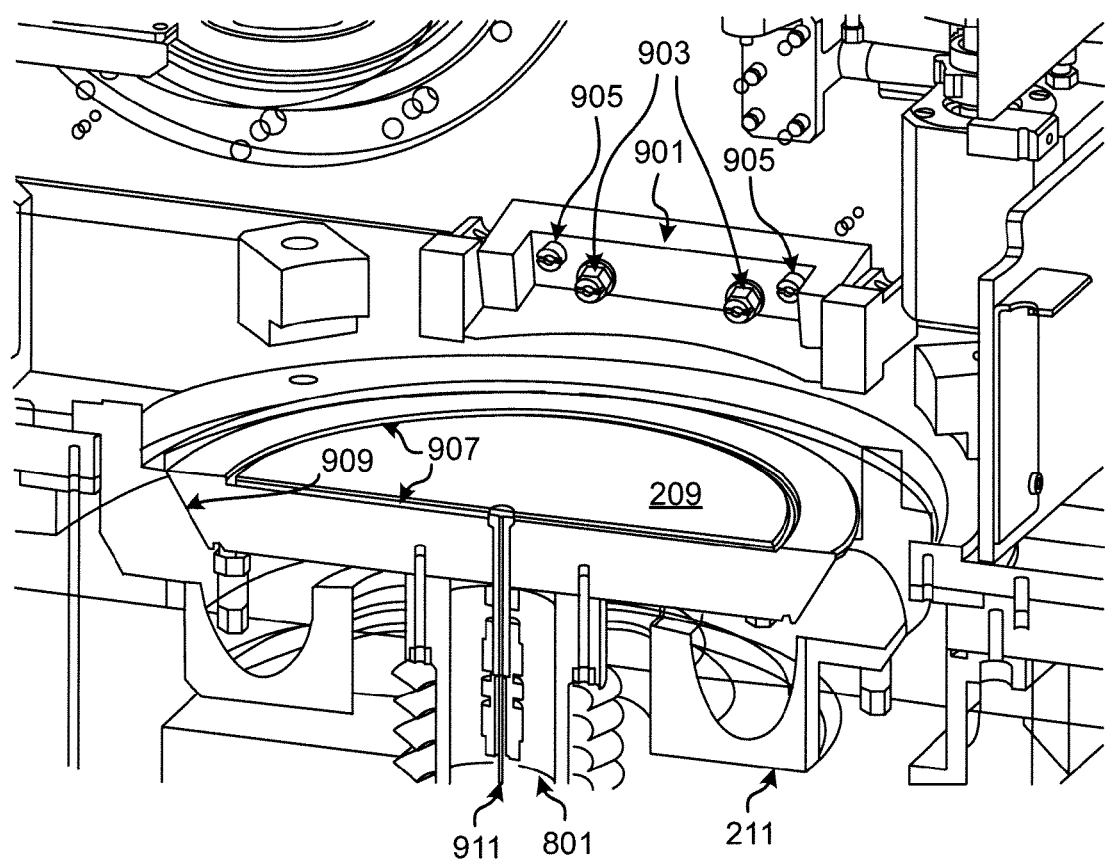
FIG. 5 is an illustration showing a vertical cross-section through the platen and fluid bowl with the platen in a fully lowered position, in accordance with one embodiment of the present invention.

With reference back to FIG. 2, the platen lift assembly 115 is defined to move the wafer 207 on the platen 209 from the wafer rotation plane, i.e., the plane where the wafer is engaged by the drive rollers 701 and stabilizer roller 605, to the processing position where the platen 209 engages a seal of the fluid bowl 211. FIG. 5 is an illustration showing a vertical cross-section through the platen 209 and fluid bowl 211 with the platen 209 in a fully lowered position, in accordance with one embodiment of the present invention. The platen 209 is defined as a heated vacuum chuck. In one embodiment, the platen 209 is fabricated from a chemically inert material. In another embodiment, the platen 209 is coated with a chemically inert material. The platen 209 includes vacuum channels 907 connected to a vacuum supply 911, which upon actuation will vacuum clamp the wafer 207 to the platen 209. Vacuum clamping of the wafer 207 to the platen 209 decreases a thermal resistance between the platen 209 and the wafer 207 and also prevents the wafer 207 from sliding during vertical transport within the chamber 100.

In various embodiments, the platen 209 can be defined to accommodate a 200 mm wafer or a 300 mm wafer. Additionally, it should be appreciated that the platen 209 and chamber 100 can be defined to accommodate essentially any size wafer. For a given wafer size, a diameter of the platen 209 upper surface, i.e., clamping surface, is defined to be slightly less than a diameter of the wafer. This platen-to-wafer sizing arrangement enables the edge of the wafer to extend slightly beyond the upper peripheral edge of the platen 209, thus enabling engagement between the wafer edge and each of the stabilizer roller 605 and drive rollers 701 when the wafer is sitting upon the platen 209.

As previously mentioned, the electroless plating process is a temperature sensitive process. The platen 209 is defined to be heated so that the temperature of the wafer 207 can be controlled. In one embodiment, the platen 209 is capable of maintaining a temperature up to 100° C. Also, the platen 209 is capable of maintaining a temperature as low as 0° C. It is anticipated that a normal platen 209 operating temperature will be about 60° C. In the embodiment where the platen 209 is sized to accommodate a 300 mm wafer, the platen 209 is defined with two interior resistive heating coils so as to form an inner heating zone and an outer heating zone, respectively. Each heating zone includes its own control thermocouple. In one embodiment, the inner heating zone utilizes a 700 Watt (W) resistive heating coil, and the outer zone utilizes a 2000 W resistive heating coil. In the embodiment where the platen 209 is sized to accommodate a 200 mm wafer, the platen 209 includes a single heating zone defined by a 1250 W interior heating coil and corresponding control thermocouple.

The fluid bowl 211 is defined to receive the platen 209 when the platen 209 is fully lowered within the chamber 100. The fluid holding capability of the fluid bowl 211 is completed when the platen 209 is lowered to engage a fluid bowl seal 909 defined about an inner periphery of the fluid bowl 211. In one embodiment, the fluid bowl seal 909 is an energized seal which forms a liquid tight seal between the platen 290 and fluid bowl 211, when the platen 209 is lowered to fully contact the fluid bowl seal 909. It should be appreciated that when the platen 209 is lowered to engage the fluid bowl seal 909, a gap exists between the platen 209 and the fluid bowl 211. Thus, engagement of the platen 209 with the fluid bowl seal 909 allows an electroplating solution to be injected into the bowl so as to fill the gap that exists between the platen 209 and the fluid bowl 211 above the fluid bowl seal 909, and well-up over the periphery of the wafer 207 that is clamped on the upper surface of the platen 209.

In one embodiment, the fluid bowl 211 includes eight fluid dispense nozzles for dispensing of the electroplating solution within the fluid bowl 211. The fluid dispense nozzles are distributed in a uniformly spaced manner around the fluid bowl 211. Each of the fluid dispense nozzles is fed by a tube from a distribution manifold such that a fluid dispense rate from each fluid dispense nozzle is substantially the same. Also, the fluid dispense nozzles are disposed such that fluid emanating from each of the fluid dispense nozzles enters the fluid bowl 211 at a location below the upper surface of the platen 209, i.e., below the wafer 207 that is clamped on the upper surface of the platen 209. Additionally, when the platen 209 and wafer 207 are not present in the fluid bowl 211, the fluid bowl 211 can be cleaned by injecting a cleaning solution into the fluid bowl 211 through the fluid dispense nozzles. The fluid bowl 211 can be cleaned at a user defined frequency. For example, the fluid bowl can be cleaned as frequently as after processing of every wafer, or as infrequently as once every 100 wafers.

The chamber 100 also includes a rinse bar 901, which includes a number of rinse nozzles 903 and a number of blowdown nozzles 905. The rinse nozzles 903 are directed to spray rinse fluid on the top surface of the wafer 207 when the platen 209 is moved to place the wafer 207 in rinse position. At the rinse position, a space will exist between the platen 209 and the fluid bowl seal 909 to enable flow of rinse fluid into the fluid bowl 211 from which it can be drained. In one embodiment, two rinse nozzles 903 are provided for rinsing a 300 mm wafer, and one rinse nozzle 903 is provided for rinsing a 200 mm wafer. The blowdown nozzles 905 are defined to direct an inert gas, such as nitrogen, toward the top surface of the wafer to assist in removing fluid from the top surface of the wafer during the rinsing process. It should be appreciated that because the electroless plating reactions continuously occur when the electroless plating solution is in contact with the wafer surface, it is necessary to promptly and uniformly remove the electroless plating solution from the wafer upon completion of the electroless plating period. To this end, the rinse nozzles 903 and blowdown nozzles 905 enable prompt and uniform removal of the electroless plating solution from the wafer 207.

Operations of the chamber 100 are supported by a fluid handling system (FHS). In one embodiment, the FHS is defined as a separate module from the chamber 100 and is connected in fluid communication with various components within the chamber 100. The FHS is defined to service the electroless plating process, i.e., the fluid bowl dispense nozzles, rinse nozzles, and blowdown nozzles. The FHS is also defined to service the upper and lower prox heads 203/205. A mixing manifold is disposed between the FHS and the supply line that services each of the fluid dispense nozzles within the fluid bowl 211. Thus, the electroless plating solution that flows to each of the fluid dispense nozzles within the fluid bowl 211 is pre-mixed prior to reaching the fluid bowl 211.

Fluid supply lines are disposed to fluidly connect the mixing manifold to the various fluid dispense nozzles within the fluid bowl 211, such that the electroplating solution will flow into the fluid bowl 211 from each fluid dispense nozzle in a substantially uniform manner, e.g., at a substantially uniform flow rate. The FHS is defined to enable a nitrogen purge of the fluid supply lines disposed between the mixing manifold and the fluid dispense nozzles within the fluid bowl 211, so as to enable clearing of the fluid supply lines of electroplating solution. The FHS is also defined to support the wafer rinsing process by providing rinsing fluid to each of the rinse nozzles 903 and by providing inert gas to each of the blowdown nozzles 905. The FHS is defined to enable manual setting of a pressure regulator to control the liquid pressure emanating from the rinse nozzles 903.

The chamber 100 includes a number of fluid drain locations. In one embodiment, three separate fluid drain locations are provided within the chamber 100: 1) a primary drain from the fluid bowl 211, 2) a chamber floor drain, and 3) a platen vacuum tank drain. Each of these drains is connected to a common facility drain provided within the FHS.

Figure 6A:
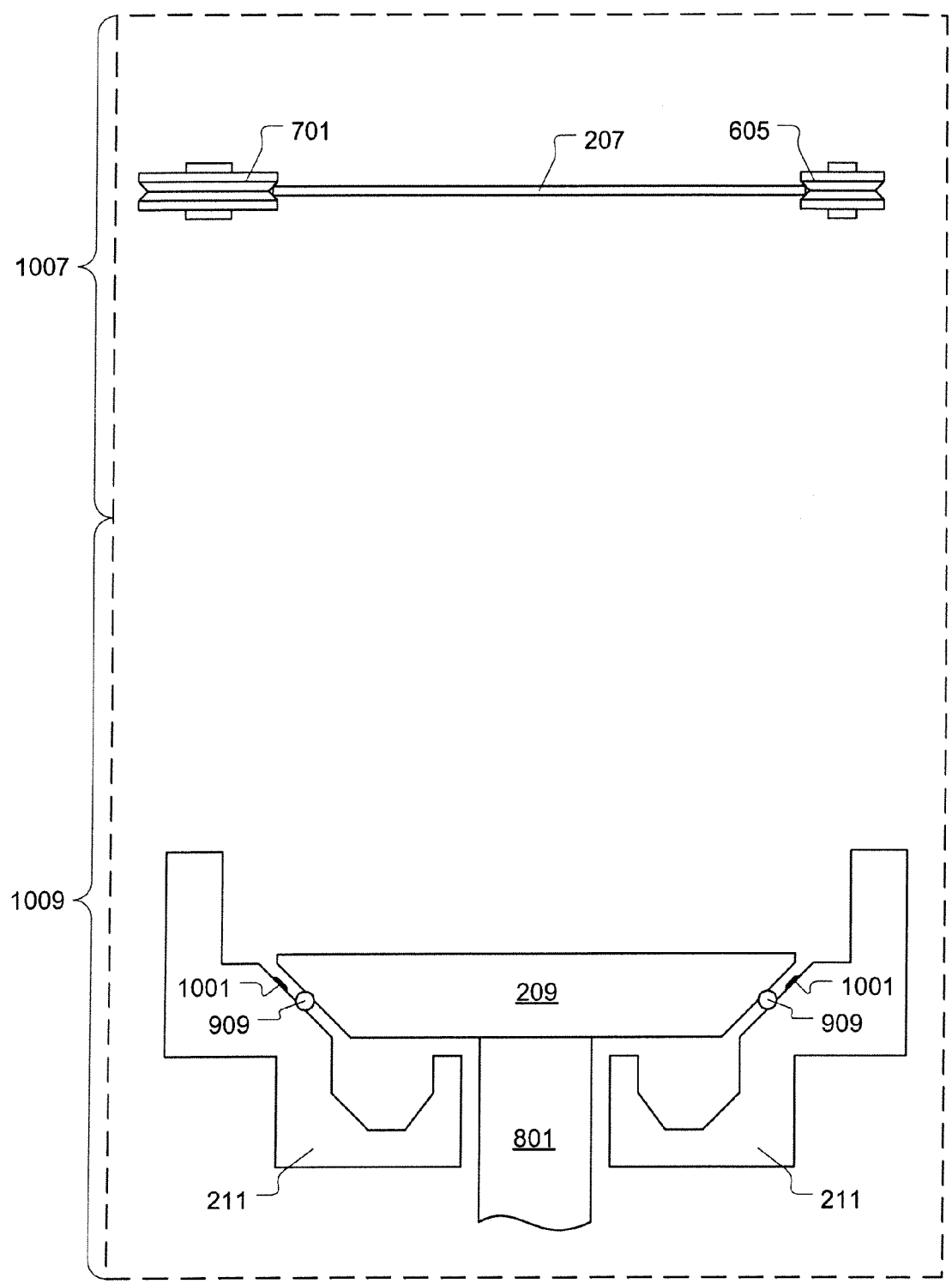
FIG. 6A is an illustration showing the wafer in the wafer handoff position within the chamber, in accordance with one embodiment of the present invention.

FIG. 6A is an illustration showing the wafer 207 in the wafer handoff position within the chamber 100, in accordance with one embodiment of the present invention. The chamber 100 is operated to accept a wafer from an exterior module, e.g., MTM, to which the chamber 100 is connected. In one embodiment, the entry door 101 is lowered and the wafer 207 is input to the chamber 100 by way of a robotic wafer handling device. When the wafer 207 is placed in the chamber 100, the drive rollers 701 and the stabilizer roller 605 are in their fully retracted positions. The wafer 207 is positioned in the chamber 100 such that the edge of the wafer 207 is proximate to the drive rollers 701 and the stabilizer roller 605. The drive rollers 701 and stabilizer roller 605 are then moved toward the edge of the wafer 207 so as to engage the edge of the wafer 207, as shown in FIG. 6A.

It should be appreciated that the wafer handoff position is also the wafer drying position within the chamber 100. The wafer handoff and drying processes occur within an upper region 1007 of the chamber 100. The fluid bowl 211 resides in a lower region 1009 of the chamber 100, directly below the wafer-handoff position. This configuration enables the platen 209 to be raised and lowered to enable movement of the wafer 207 from the wafer-handoff position to the wafer processing position in the lower region 1009. During the wafer handoff process, the platen 209 is in a fully lowered position to avoid interference of the platen 209 with the robotic wafer handling device.

In one embodiment, the following conditions should be met within the chamber 100 prior to initiating placement of the wafer 207 within the chamber 100:

Verify that there is not already a wafer in the chamber.

Verify that the drive rollers 701 are in their fully retracted position.

Verify that the stabilizer roller 605 is in its fully retracted position.

Verify that liquid input into the chamber is turned off prior to lowering the entry door 101.

Verify that the upper and lower prox heads 203/205 are in their home positions on the prox head docking station 201.

Verify that the pressure within the chamber 100 is sufficiently close to the pressure within the external module to which the chamber 100 internal volume will be exposed when the chamber 100 is opened to receive the wafer 207. In one embodiment, a sufficiently close pressure within the chamber 100 is within +/−10 Ton of the external module pressure.

Verify that the oxygen content within the chamber 100 is sufficiently close to the oxygen content within the external module to which the chamber 100 internal volume will be exposed when the chamber 100 is opened to receive the wafer 207. In one embodiment, a sufficiently close oxygen content within the chamber 100 is within +/−5 ppm of the external module oxygen content.

Verify that entry door 101 is lowered.

The wafer 207 transfer sequence into the chamber 100 begins by opening the rocker valve which seals the chamber 100 from the external module. Then, the wafer 207 is extended into the chamber 100 by way of the robotic wafer handling device, so that the wafer 207 is located at the wafer handoff position. The drive rollers 701 are then moved to their fully extended position toward the edge of the wafer 207. The stabilizer roller 605 is then moved toward the wafer 207 so as to engage the edge of the wafer 207 and cause the edge of the wafer 207 to also be engaged by the driver rollers 701. A positive engagement of the wafer 207 by the stabilizer roller 605 will indicate that the wafer 207 is present in its proper position within the chamber 100. The robotic wafer handling device is then lowered from the wafer 207 and retracted from the chamber 100. The entry door 101 and rocker valve are then closed.

Figure 6B:
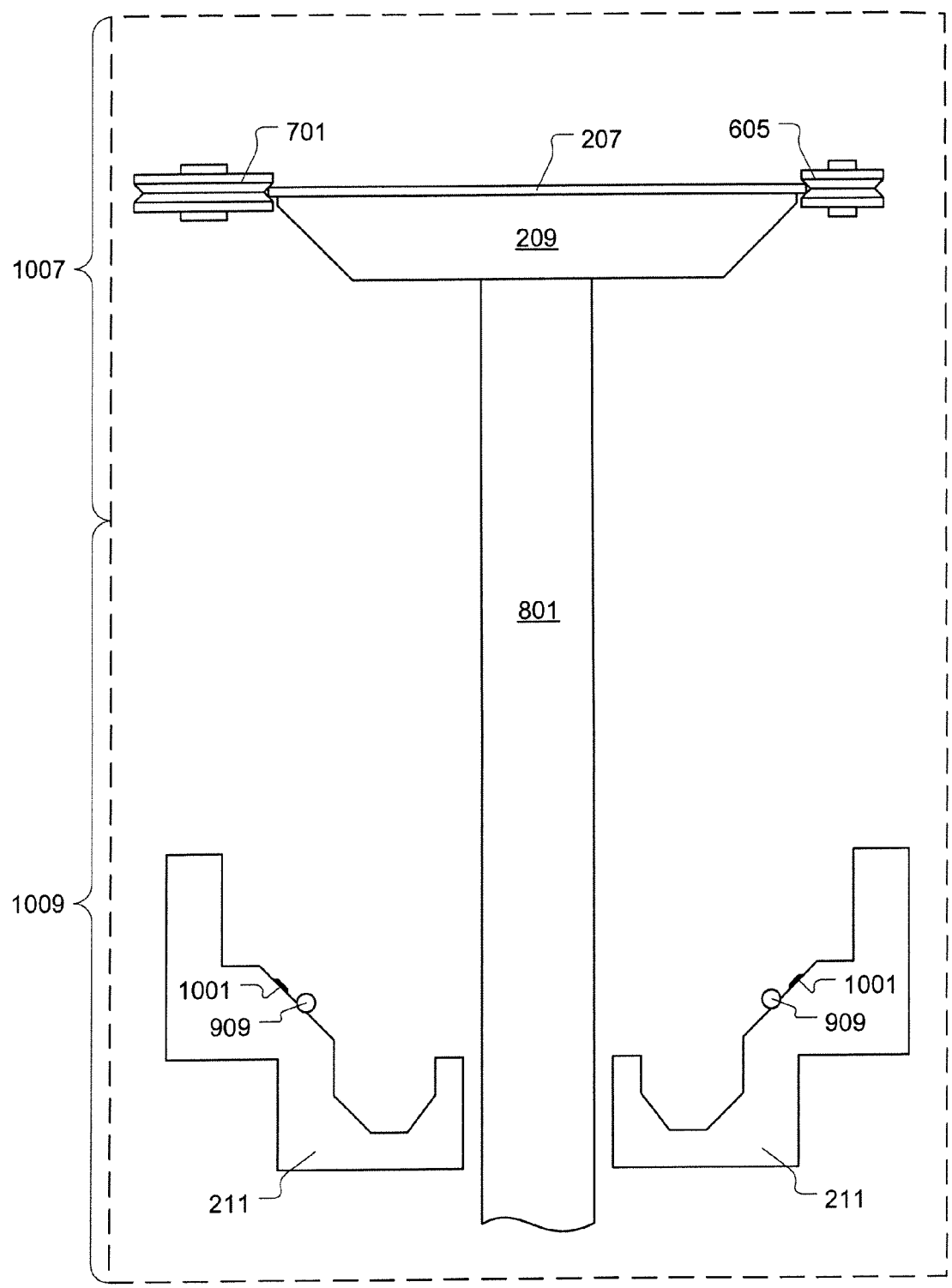
FIG. 6B is an illustration showing the platen raised to the wafer handoff position, in accordance with one embodiment of the present invention.

Following receipt of the wafer 207 within the chamber 100, the wafer 207 is moved to the lower region 1009 of the chamber 100 for processing. By way of the platen lift assembly 115 and shaft 801, the platen 209 is used to transport the wafer 207 from the upper region 1007 of the chamber 100 to the lower region 1009 of the chamber 207. FIG. 6B is an illustration showing the platen 209 raised to the wafer handoff position, in accordance with one embodiment of the present invention. Prior to raising the platen 209, a verification is made that the upper and lower prox heads 203/205 are in their home positions. Also, prior to raising the platen 209, the wafer 207 can be rotated as necessary by way of the drive rollers 701. The platen 209 is then raised to the wafer pickup position. At the wafer pickup position, the vacuum supply to the platen 209 is activated. The stabilizer roller 605 is moved to its retracted position away from the wafer 207. Also, the drive rollers 701 are moved to their retracted position away from the wafer 207. At this point the wafer 207 is vacuum chucked to the platen 209. In one embodiment, the vacuum pressure of the platen is verified to be less than a maximum user specified value. If the vacuum pressure of the platen is acceptable the wafer handoff process proceeds. Otherwise, the wafer handoff process aborts.

Figure 6C:
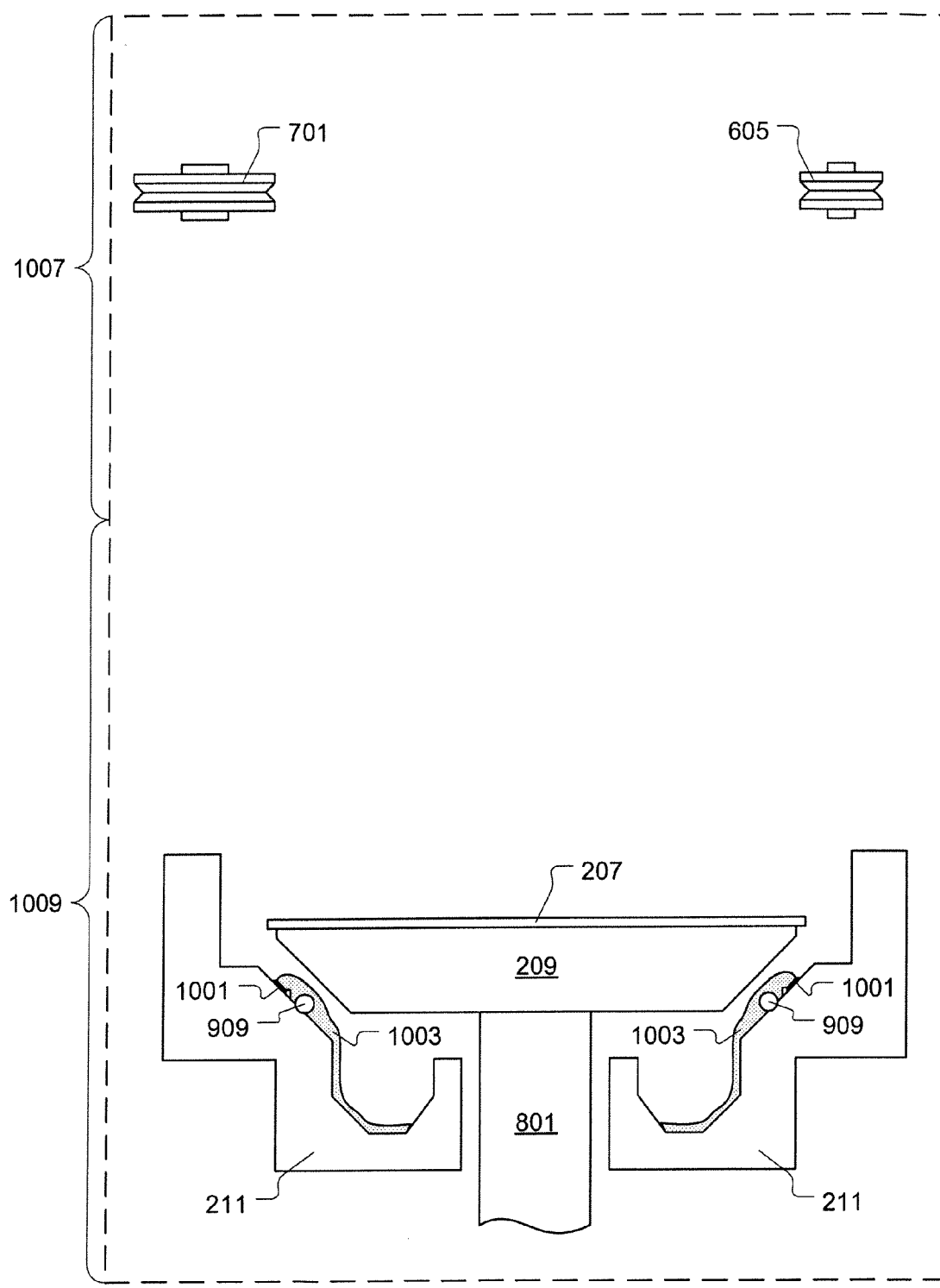
FIG. 6C is an illustration showing the platen in the hovering position just above the sealing position, in accordance with one embodiment of the present invention.

The platen 209 is heated to a user specified temperature, and the wafer 207 is held on the platen 209 for a user specified duration to allow the wafer 207 to heat up. The platen 209 with wafer thereon is then lowered to a hovering position just above a position at which the platen 209 would engage the fluid bowl seal 909, i.e., just above the sealing position. FIG. 6C is an illustration showing the platen 209 in the hovering position just above the sealing position, in accordance with one embodiment of the present invention. The distance between the platen 209 and the fluid bowl seal 909 in the hovering position is a user selectable parameter. In one embodiment, the distance between the platen 209 and the fluid bowl seal 909 in the hovering position is within a range extending from about 0.05 inch to about 0.25 inch.

When the platen 209 with the wafer 207 thereon is in the hovering position, the electroless plating process can commence. Prior to the electroless plating process, the FHS is operated to recirculate the electroless plating chemicals in a pre-mixed state. While the platen 209 is maintained in the hovering position, a flow of the electroless plating solution 1003 into the fluid bowl 211 by way of fluid dispense nozzles 1001 is initiated. The flow of electroless plating solution 1003 when the platen 209 is in the hovering position is referred to as a stabilizing flow. During the stabilizing flow, the electroless plating solution 1003 flows from the fluid dispense nozzles down between the platen 209 and fluid bowl seal 909 into the fluid bowl 211 drain basin. The fluid dispense nozzles 1001 are disposed in a substantially uniformly spaced manner about a periphery of the fluid bowl 211 so as to be positioned uniformly about a periphery of the underside of the platen 209 when the platen 209 is lowered to engage the fluid bowl seal 909. Also, each of the fluid dispense nozzles 1001 is positioned so that electroless plating solution 1003 dispensed therefrom is dispensed at a location below the wafer 207 held atop the platen 209.

The stabilizing flow allows the flow of electroless plating solution 1003 to each of the fluid dispense nozzles 1001 to stabilize prior to lowering of the platen 209 to engage the fluid bowl seal 909. The stabilizing flow continues until either a user specified amount of time has elapsed or until a user specified volume of electroless plating solution 1003 has been dispensed from the fluid dispense nozzles 1001. In one embodiment, the stabilizing flow continues for a period of time extending from about 0.1 second to about 2 seconds. Also, in one embodiment, the stabilizing flow continues until a volume of electroless plating solution 1003 extending from about 25 mL to about 500 mL has been dispensed from the fluid dispense nozzles 1001.

Figure 6D:
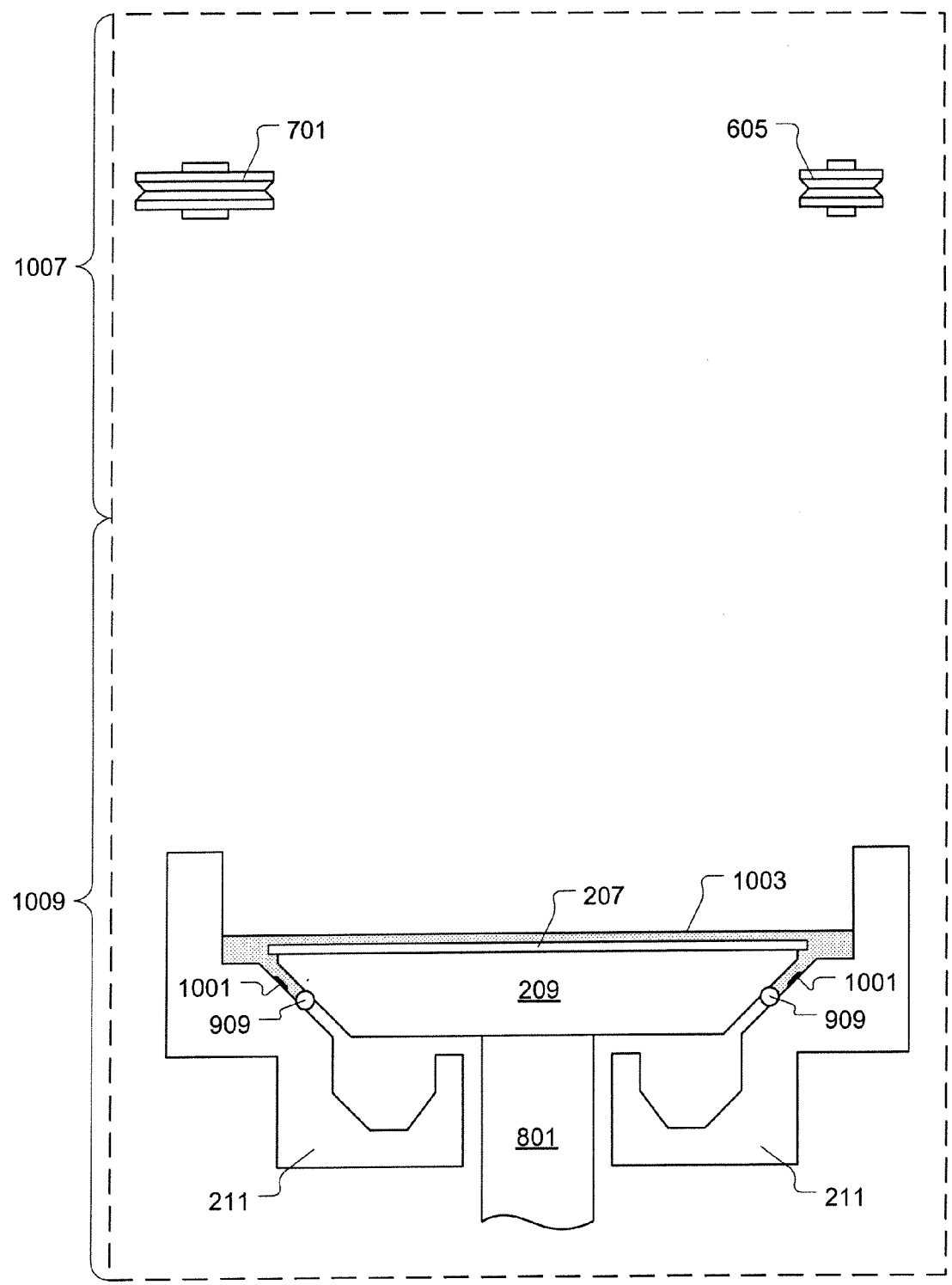
FIG. 6D is an illustration showing the platen lowered to engage the fluid bowl seal following completion of the stabilizing flow, in accordance with one embodiment of the present invention.

At the conclusion of the stabilizing flow, the platen 209 is lowered to engage the fluid bowl seal 909. FIG. 6D is an illustration showing the platen 209 lowered to engage the fluid bowl seal 909 following completion of the stabilizing flow, in accordance with one embodiment of the present invention. Upon engagement of the fluid bowl seal 909 by the platen 209, the electroless plating solution 1003 flowing from the fluid dispense nozzles 1001 will fill the space between the fluid bowl 211 and the platen 209 so as to well up and over the periphery of the wafer 207. Because the fluid dispense nozzles 1001 are substantially uniformly disposed about the periphery of the platen 209, the electroless plating solution 1003 will rise over the peripheral edge of the wafer in a substantially uniform manner so as to flow from the periphery of the wafer 207 toward the center of the wafer 207 in a substantially concentric manner.

In one embodiment, after the fluid bowl seal 909 has been engaged by the platen 209, an additional volume of electroless plating solution 1003 extending from about 200 mL to about 1000 mL is dispensed from the fluid dispense nozzles 1001. Dispensing of the additional electroless plating solution 1003 may take from about 1 second to about 10 seconds. Following the dispensing of the additional electroless plating solution 1003 so as to cover the entire wafer 207 surface with electroless plating solution 1003, a user defined period of time is allowed to elapse during which electroless plating reactions occur on the wafer surface.

Figure 6E:
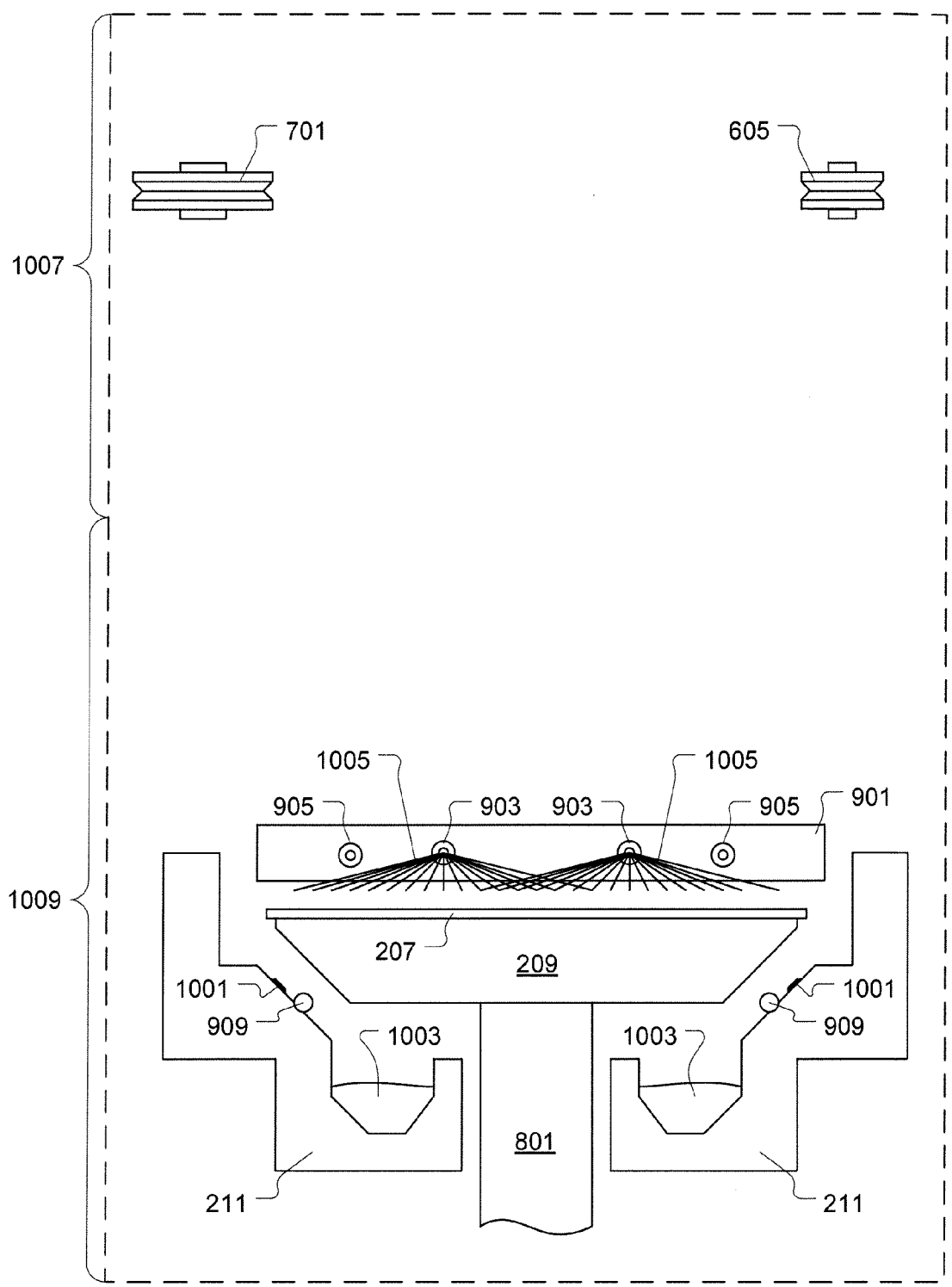
FIG. 6E is an illustration showing the wafer undergoing the rinsing process, in accordance with one embodiment of the present invention.

Immediately following the user defined time period for electroless plating reaction, the wafer 207 is subjected to a rinsing process. FIG. 6E is an illustration showing the wafer 207 undergoing the rinsing process, in accordance with one embodiment of the present invention. For the rinsing process, the platen 209 is raised to a wafer rinse position. When the platen 209 is raised, the seal between the platen 209 and the fluid bowl seal 909 is broken, and the majority of the electroless plating solution 1003 above the wafer 207 will flow to the fluid bowl 211 drain basin. The remaining electroless plating solution 1003 on the wafer 207 is removed by dispensing a rinse fluid 1005 from the rinse nozzles 903 onto the wafer 207. In one embodiment, the rinse fluid 1005 is deionized water (DIW). In one embodiment, the rinse nozzles 903 are fed from a single valve within the FHS. If necessary, the platen 209 can be moved during the rinsing process. Additionally, an inert gas such as nitrogen can be dispensed from the blow down nozzles 905 to blow liquid off of the wafer surface. The activation and duration of the rinse fluid 1005 flow and the inert blow down gas flow are user specified parameters.

Following the wafer rinsing process, the wafer 207 is moved to the wafer drying position, which is the same as the wafer handoff position. With reference back to FIG. 6B, the platen 209 is raised so as to position the wafer 207 proximate to the driver rollers 701 and stabilizer roller 605. Prior to raising the platen 209 from the rinsing position, a verification is made that the upper and lower prox heads 203/205 are in their home positions, the drive rollers 701 are fully retracted, and stabilizer roller 605 is fully retracted. Once the wafer is raised to the drying position, the drive rollers 701 are moved to their fully extended position, and the stabilizer roller 605 is moved to engage the edge of the wafer 207 so as to also cause the drive rollers 701 to engage the edge of the wafer 207. At this point the vacuum supply to the platen 209 is turned off and the platen is lowered slightly away from the wafer 207. Once the wafer 207 is verified as being securely held by the driver rollers 701 and stabilizer roller 605, the platen 209 is lowered to the fluid bowl sealing position, at which the platen 209 remains for the duration of the wafer processing within the chamber.

Figure 6F:
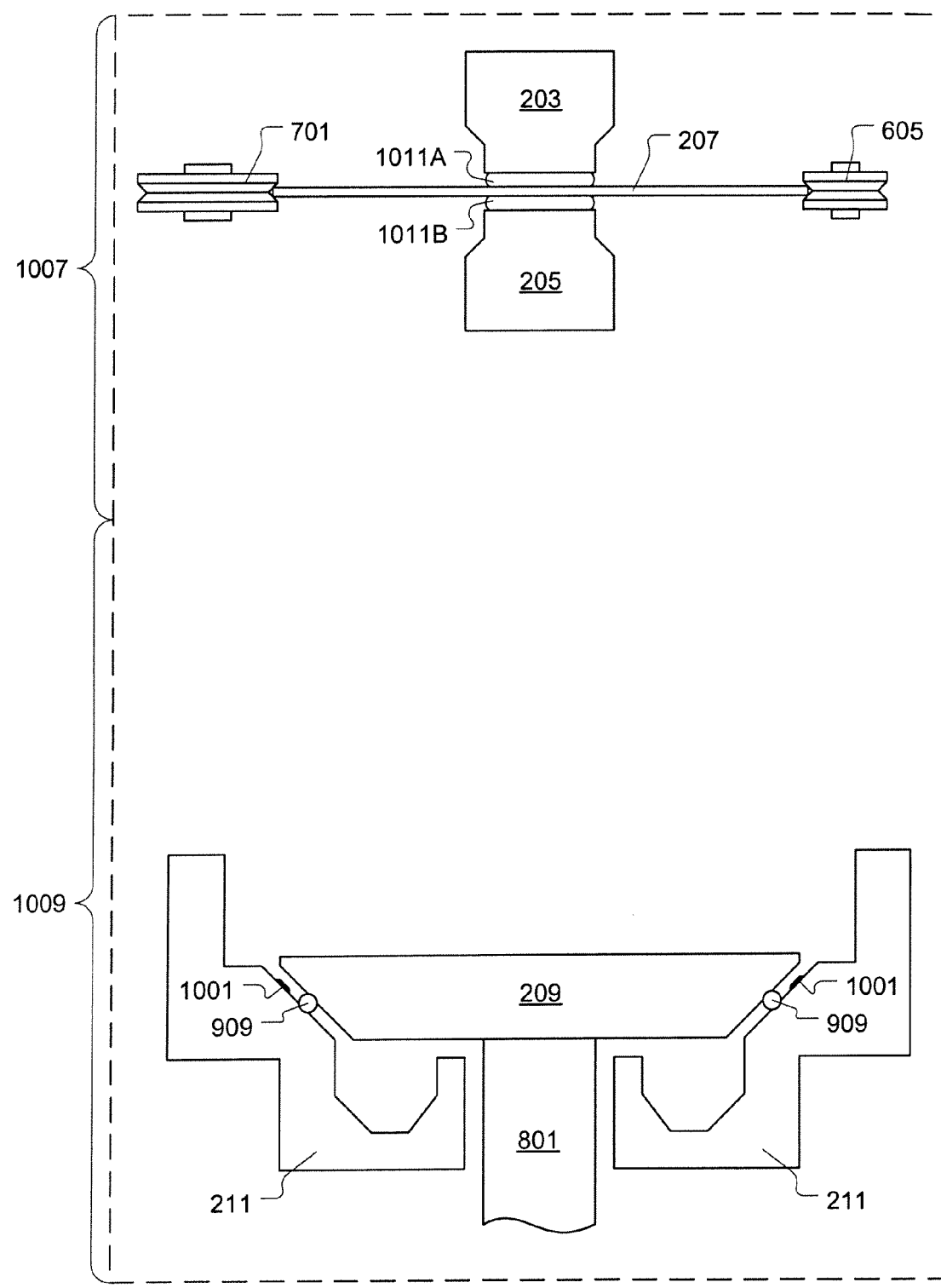
FIG. 6F is an illustration showing the wafer undergoing a drying process by way of the upper and lower prox heads, in accordance with one embodiment of the present invention.

FIG. 6F is an illustration showing the wafer 207 undergoing a drying process by way of the upper and lower prox heads 203/205, in accordance with one embodiment of the present invention. In one embodiment, flow to the upper and lower prox heads 203/205 is initiated with the prox heads at the prox head docking station 201. In another embodiment, the upper and lower prox heads 203/205 are moved to the center of the wafer 207 prior to initiating flow to the prox heads. To initiate flow to the prox heads 203/205, vacuum to both the upper and lower prox heads 203/205 is initiated. Then, following a user defined period, nitrogen and isopropyl alcohol (IPA) are flowed to the upper and lower prox heads 203/205 at a recipe defined flow rate, so as to form upper and lower drying meniscuses 1011A/1011B. If the flow is initiated at the prox head docking station 201, the upper and lower prox heads 203/205 are moved to the wafer center as the wafer is rotated. If the flow is initiated at the wafer center, the upper and lower prox heads 203/205 are moved to the wafer docking station 201 as the wafer is rotated. Wafer rotation during the drying process is initiated at an initial rotation speed and adjusted as the prox heads 203/205 are scanned across the wafer. In one embodiment, during the drying process, the wafer will be rotated a rate extending from about 0.25 revolution per minute (rpm) to about 10 rpm. The wafer rotation speed will vary as a function of the prox head 203/205 radial position over the wafer. Also, a scanning speed of the upper and lower prox heads 203/205 is initiated at an initial scan speed and adjusted as the prox heads 203/205 are scanned across the wafer. In one embodiment, the prox heads 203/205 are scanned across the wafer at a rate extending from about 1 mm/sec to about 75 mm/sec. At the conclusion of the drying process, the upper and lower prox heads 203/205 are moved to the prox head docking station 201, the IPA flow to the prox heads 203/205 is stopped, the nitrogen flow to the prox heads 203/205 is stopped, and the vacuum supply to the prox heads 203/205 is stopped.

During the drying process, the upper and lower prox heads 203/205 are positioned in close proximity to a top surface 207A and a bottom surface 207B of the wafer 207, respectively. Once in this position, the prox heads 203/205 may utilize the IPA and DIW source inlets and a vacuum source outlet(s) to generate wafer processing meniscuses 1011A/1011B in contact with the wafer 207 which are capable of applying and removing fluids from the top and bottom surfaces of the wafer 207. The wafer processing meniscuses 1011A/1011B may be generated in accordance with the descriptions provided with regard to FIG. 7, where IPA vapor and DIW are input into the region between the wafer 207 and the prox heads 203/205. At substantially the same time the IPA and DIW is input, a vacuum may be applied in close proximity to the wafer surface to output the IPA vapor, the DIW, and the fluids that may be on a wafer surface. It should be appreciated that although IPA is utilized in the exemplary embodiment, any other suitable type of vapor may be utilized such as any suitable alcohol vapor, organic compounds, hexanol, ethyl glycol, etc. that may be miscible with water. Alternatives to IPA include but are not limited to the following: diacetone, diaceton alcohol, 1-methoxy-2-propanol, ethylglycol, methyl-pyrrolidon, ethyllactate, 2-butanol. These fluids may also be known as surface tension reducing fluids. The surface tension reducing fluids act to increase the surface tension gradient between the two surfaces (i.e., between the prox heads 203/205 and the surface of the wafer 207.

The portion of the DIW that is in the region between the prox heads 203/205 and the wafer 207 is the dynamic liquid meniscus 1011A/1011B. It should be appreciated that as used herein, the term "output" can refer to the removal of fluid from a region between the wafer 207 and a particular prox head 203/205, and the term "input" can be the introduction of fluid to the region between the wafer 207 and the particular prox head 203/205.

Figure 7:
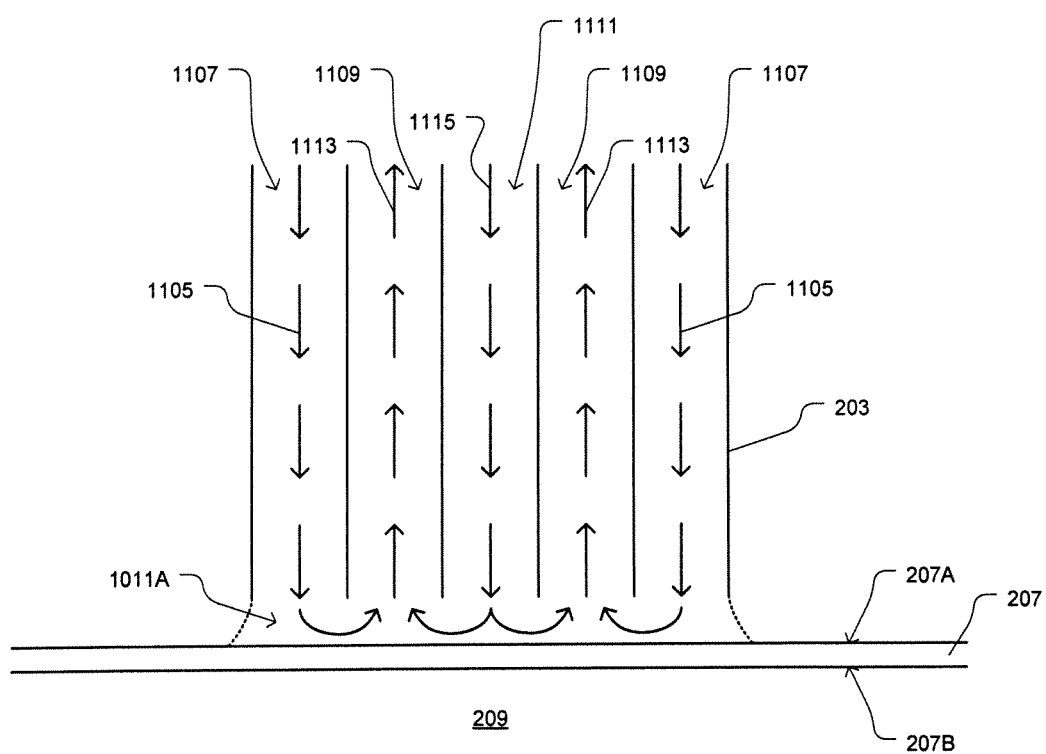
FIG. 7 is an illustration showing an exemplary process that may be conducted by a prox head, in accordance with one embodiment of the present invention.

FIG. 7 is an illustration showing an exemplary process that may be conducted by a prox head 203/205, in accordance with one embodiment of the present invention. Although FIG. 7 shows a top surface 207A of the wafer 207 being processed, it should be appreciated that the process may be accomplished in substantially the same way for a bottom surface 207B of the wafer 207. While FIG. 7 illustrates a substrate drying process, many other fabrication processes (e.g., etching, rinsing, cleaning, etc.) may also be applied to the wafer surface in a similar manner. In one embodiment, a source inlet 1107 may be utilized to apply isopropyl alcohol (IPA) vapor toward the top surface 207A of the wafer 207, and a source inlet 1111 may be utilized to apply deionized water (DIW) toward the top surface 207A. In addition, a source outlet 1109 may be utilized to apply vacuum to a region in close proximity to the surface 207A to remove fluid or vapor that may located on or near the surface 207A.

It should be appreciated that any suitable combination of source inlets and source outlets may be utilized as long as at least one combination exists where at least one of the source inlet 1107 is adjacent to at least one of the source outlet 1109 which is in turn adjacent to at least one of the source inlet 1111. The IPA may be in any suitable form such as, for example, IPA vapor where IPA in vapor form is inputted through use of a nitrogen carrier gas. Moreover, although DIW is utilized herein, any other suitable fluid may be utilized that may enable or enhance the substrate processing such as, for example, water purified in other ways, cleaning fluids, and other processing fluids and chemistries. In one embodiment, an IPA inflow 1105 is provided through the source inlet 1107, a vacuum 1113 is applied through the source outlet 1109, and DIW inflow 1115 is provided through the source inlet 1111. If a fluid film resides on the wafer 207, a first fluid pressure may be applied to the substrate surface by the IPA inflow 1105, a second fluid pressure may be applied to the substrate surface by the DIW inflow 1115, and a third fluid pressure may be applied by the vacuum 1113 to remove the DIW, IPA, and the fluid film on the substrate surface.

It should be appreciated that by controlling the fluid flow amount onto the wafer surface 207A and by controlling the vacuum applied, the meniscus 1011A may be managed and controlled in any suitable manner. For example, in one embodiment, by increasing the DIW flow 1115 and/or decreasing the vacuum 1113, the outflow through the source outlet 1109 may be nearly all DIW and the fluids being removed from the wafer surface 207A. In another embodiment, by decreasing the DIW flow 1115 and/or increasing the vacuum 1113, the outflow through the source outlet 1109 may be substantially a combination of DIW and IPA as well as fluids being removed from the wafer surface 207A.

Following the wafer drying process, the wafer 207 can be returned to the external module, e.g., MTM. In one embodiment, the following conditions should be met within the chamber 100 prior to initiating the wafer transfer back to the external module:

- Verify that liquid input into the chamber is turned off prior to lowering the entry door 101.
- Verify that entry door 101 is lowered.
- Verify that the upper and lower prox heads 203/205 are in their home positions on the prox head docking station 201.
- Verify that the pressure within the chamber 100 is sufficiently close to the pressure within the external module to which the chamber 100 internal volume will be exposed when the chamber 100 is opened to receive the wafer 207. In one embodiment, a sufficiently close pressure within the chamber 100 is within +/−10 Torr of the external module pressure.
- Verify that the oxygen content within the chamber 100 is sufficiently close to the oxygen content within the external module to which the chamber 100 internal volume will be exposed when the chamber 100 is opened to receive the wafer 207. In one embodiment, a sufficiently close oxygen content within the chamber 100 is within +/−5 ppm of the external module oxygen content.

The process of transferring the wafer back to the external module includes opening of the rocker valve which seals the chamber 100 from the external module. Then, the robotic wafer handling device is inserted into the chamber at a position so as to retrieve the wafer from the wafer drying position. The stabilizer roller 605 is then moved away from the wafer 207 to its fully retracted position. The drive rollers 701 are then moved to their fully retracted position away from the wafer 207. At this point, the wafer is held by the robotic handling device. The robotic wafer handling device with the wafer held thereon is then retracted from the chamber 100. The entry door 101 and rocker valve are then closed.

Figure 8:
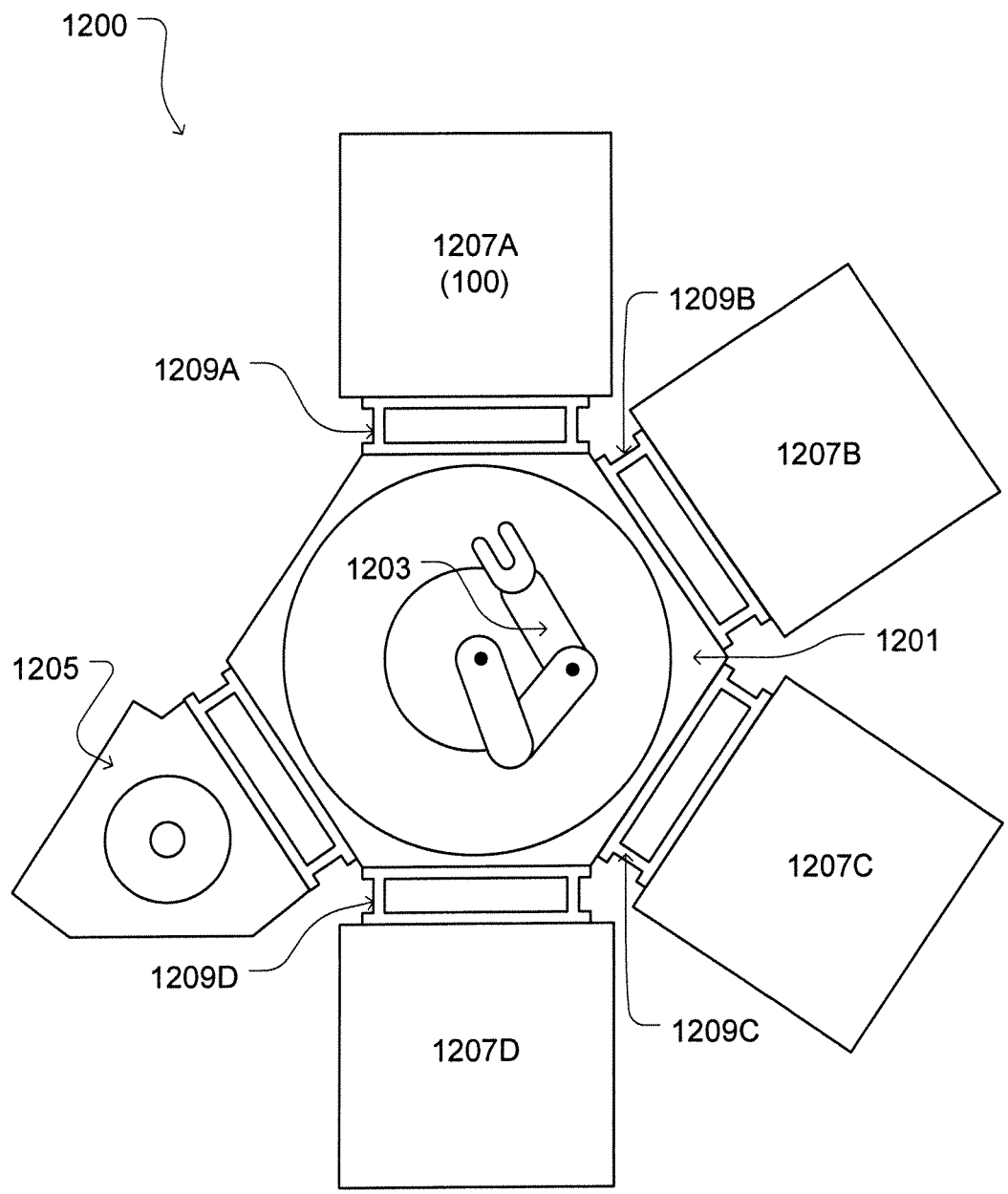
FIG. 8 is an illustration showing a cluster architecture, in accordance with one embodiment of the present invention.

FIG. 8 is an illustration showing a cluster architecture 1200, in accordance with one embodiment of the present invention. The cluster architecture 1200 includes a controlled ambient transfer module 1201, i.e., a managed transfer module (MTM) 1201. The MTM 1201 is connected to a load lock 1205 by way of a slot valve 1209E. The MTM 1201 includes a robotic wafer handling device 1203, i.e., end effector 1203, that is capable of retrieving a wafer from the load lock 1205. The MTM 1201 is also connected with a number of process modules 1207A, 1207B, 1207C, and 1207D through respective slot valves 1209A, 1209B, 1209C, and 1209D. In one embodiment, the processing modules 1207A-1207D are controlled ambient wet processing modules. The controlled ambient wet processing modules 1207A-1207D are configured to process a surface of a wafer in a controlled inert ambient environment. The controlled inert ambient environment of the MTM 1203 is managed such that an inert gas is pumped into the MTM 1203, and oxygen is purged out of the MTM 1203. In one embodiment, the electroless plating chamber 100 can be connected to the MTM 1203 as a processing module. For example, FIG. 8 shows that processing module 1207A is actually the dry-in/dry-out electroless plating chamber 100.

By removing all or most of the oxygen from the MTM 1203 and replacing it with an inert gas, the MTM 1203 will provide a transition environment which does not expose a just-processed wafer before or after an electroless plating process is performed thereon in the chamber 100. In specific embodiments, the other processing modules 1207B-1207D may be electroplating modules, electroless plating modules, dry-in/dry-out wet process modules, or other types of modules that will enable the application, formation, removal, or deposition of a layer on top of a wafer surface or feature, or other types of wafer processing.

In one embodiment, monitoring and control of the chamber 100 and interfacing equipment, e.g., FHS, is provided through a graphical user interface (GUI) operating on a computer system that is remotely located with respect to the processing environment. Various sensors within the chamber 100 and interfacing equipment are connected to provide a read out in the GUI. Each electronically actuated control within the chamber 100 and interfacing equipment can be actuated through the GUI. The GUI is also defined to display warnings and alarms based on various sensor readings within the chamber 100 and interfacing equipment. The GUI is further defined to indicate a process state and system conditions.

The chamber 100 of the present invention incorporates a number of advantageous features. For example, the implementation of upper and lower prox heads 203/205 within the chamber 100 provides the chamber 100 with a dry-in/dry-out wafer electroless plating process capability. The dry-in/dry-out capability enables the chamber 100 to interface with the MTM, enables tighter control of chemical reactions on the wafer surface, and prevents the carrying of chemicals outside of the chamber 100.

The double walled configuration of the chamber 100 also provides advantages. For example, the outer structural wall provides for strength and interface precision, while the inner liner provides a chemical boundary to keep chemicals from reaching the outer structural wall. Because the outer structure wall is responsible for providing the vacuum boundary, the inner liner does not have to be capable of providing a vacuum boundary, thus enabling the inner wall to be fabricated from inert materials such as plastic. Additionally, the inner wall is removable to facilitate chamber 100 cleaning or re-equipping. Also, the strength of the outer wall enables a decrease in time required to achieve an inert ambient condition within the chamber 100.

The chamber 100 provides for control of ambient conditions within the chamber 100. Use of an inert ambient condition during drying enables creation of a surface tension gradient (STG) which in turn enables the prox head processes. For example, a carbon dioxide ambient condition can be established within the chamber 100 to assist with creation of STG during the prox head drying process. The integration of STG drying, i.e., prox head drying, within a wet process chamber, i.e., within an electroless plating chamber, enables a multi-stage process capability. For example, the multi-stage process may include a pre-clean operation by way of the prox heads in the upper region of the chamber, an electroless plating process in the lower region of the chamber, and post-clean and drying operations by way of the prox heads in the upper region of the chamber.

Furthermore, the chamber 100 is configured to minimize an amount of required electroless plating solution, thereby enabling use of single-shot chemistry, i.e., single use and discard chemistry. Also, a point of use mixing approach is implemented to control electrolyte activation before deposition on wafer. This is accomplished by use of the mixing manifold which incorporates an injector tube, where the activating chemistry is injected into a flow stream of chemicals surrounding the injector tube, as close as possible to the fluid bowl dispense locations. This increases reactant stability, and reduces defects. Additionally, the quenching rinse capability of the chamber 100 provides for greater control over electroless plating reaction time on the wafer. The chamber 100 is further configured to be easily cleaned by introducing a "backflush" chemistry into the limited volume of the fluid bowl. The "backflush" chemistry is formulated to remove metal contaminants that may be introduced by the electroless plating solution. In other embodiments, the chamber 100 can be further configured to incorporate various types of in-situ metrology. Also, in some embodiments, the chamber 100 can include radiant or absorptive heating sources to initiate electroless plating reactions on the wafer.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for semiconductor wafer electroless plating, comprising:
   receiving a wafer in a dry state in an upper region of a chamber volume;
   moving a platen upward from a lower region of the chamber volume to support the wafer as received in the upper region of the chamber volume;
   moving the platen with the wafer supported thereon downward to the lower region of the chamber volume to a position within a fluid bowl located within the lower region of the chamber volume so as to cause the platen to engage a seal positioned against an interior surface of the fluid bowl; and
   dispensing an electroless plating solution within a liquid retaining volume defined around the platen and at a location below the wafer and at a location above the seal, wherein the electroless plating solution is dispensed to fill the liquid retaining volume and rise up and flow over a top surface of the wafer in a substantially uniform manner;
   moving the platen with the wafer supported thereon upward so as to disengage the seal such that the electroless plating solution drains from the liquid retaining volume and such that the electroless plating solution is removed from the top surface of the wafer;
   holding the platen with the wafer supported thereon at a rinsing position within the fluid bowl;
   rinsing the top surface of the wafer at the rinsing position within the fluid bowl and
   moving the platen with the wafer supported thereon upward from the rinsing position to a wafer handoff and drying position within the upper region of the chamber volume.

2. A method for semiconductor wafer electroless plating as recited in claim 1, further comprising:
   engaging the wafer with driver rollers and a stabilizer roller at the wafer handoff and drying position.

3. A method for semiconductor wafer electroless plating as recited in claim 2, wherein a peripheral edge of the wafer is engaged by the driver rollers and the stabilizer roller.

4. A method for semiconductor wafer electroless plating as recited in claim 2, further comprising:
   moving the platen without the wafer supported thereon downward away from the wafer handoff and drying position such that the wafer remains held by the driver rollers and the stabilizer roller in the wafer handoff and drying position.

5. A method for semiconductor wafer electroless plating as recited in claim 4, further comprising:
   performing a drying process on the wafer while the wafer is held in wafer handoff and drying position within the upper region of the chamber volume.

6. A method for semiconductor wafer electroless plating as recited in claim 5, wherein the drying process is performed on a top surface of the wafer by scanning an upper proximity head over the top surface of the wafer so as to subject the top surface of the wafer to a first dynamic liquid meniscus, and wherein the drying process is performed on a bottom surface of the wafer by scanning a lower proximity head over the bottom surface of the wafer so as to subject the bottom surface of the wafer to a second dynamic liquid meniscus.

7. A method for semiconductor wafer electroless plating as recited in claim 6, further comprising:
   maintaining the upper proximity head at a position directly above the lower proximity head during the drying process.

8. A method for semiconductor wafer electroless plating as recited in claim 7, further comprising:
   controlling an ambient condition within the chamber volume so as to minimize an oxygen content within the chamber volume.

9. A method for semiconductor wafer electroless plating as recited in claim 7, further comprising:
   operating the driver rollers and the stabilizer roller to rotate the wafer during the drying process.

10. A method for semiconductor wafer electroless plating as recited in claim 9, wherein the upper proximity head and the lower proximity head are scanned in a radial direction extending between a periphery of the wafer and a center of the wafer.

11. A method for semiconductor wafer electroless plating as recited in claim 1, wherein dispensing of the electroless plating solution is initiated before moving the platen with the wafer supported thereon downward to the lower region of the chamber volume to engage the seal.

12. A method for semiconductor wafer electroless plating, comprising:
   receiving a wafer in a dry state in an upper region of a chamber volume;
   moving a platen upward from a lower region of the chamber volume to support the wafer as received in the upper region of the chamber volume;
   moving the platen with the wafer supported thereon downward to the lower region of the chamber volume to a position within a fluid bowl located within the lower region of the chamber volume so as to cause the platen to engage a seal positioned against an interior surface of the fluid bowl; and
   dispensing an electroless plating solution through a number of fluid nozzles positioned above the seal and below a top surface of the platen when the platen is engaged with the seal, wherein the electroless plating solution is dispensed from the number of fluid nozzles within a space between the interior surface of the fluid bowl and an outer surface of the platen when the platen is engaged with the seal, wherein the space between the interior surface of the fluid bowl and the outer surface of the platen and above the seal is open to a volume overlying the platen.

13. A method for semiconductor wafer electroless plating as recited in claim 12, wherein dispensing of the electroless plating solution is initiated before moving the platen with the wafer supported thereon downward to the lower region of the chamber volume to engage the seal.

14. A method for semiconductor wafer electroless plating as recited in claim 12, wherein the electroless plating solution is dispensed such that the electroless plating solution fills the space between the interior surface of the fluid bowl and the outer surface of the platen when the platen is engaged with the seal and such that the electroless plating solution rises up and over the wafer supported on the platen.

15. A method for semiconductor wafer electroless plating as recited in claim 14, further comprising:
   moving the platen with the wafer supported thereon upward so as to disengage the seal such that the electroless plating solution is removed from the top surface of the wafer;
   holding the platen with the wafer supported thereon at a rinsing position within the fluid bowl;
   rinsing the top surface of the wafer at the rinsing position within the fluid bowl; and
   moving the platen with the wafer supported thereon upward from the rinsing position to a wafer handoff and drying position within the upper region of the chamber volume.

16. A method for semiconductor wafer electroless plating as recited in claim 15, further comprising:
   engaging the wafer with driver rollers and a stabilizer roller at the wafer handoff and drying position.

17. A method for semiconductor wafer electroless plating as recited in claim 16, further comprising:
   moving the platen without the wafer supported thereon downward away from the wafer handoff and drying position such that the wafer remains held by the driver rollers and the stabilizer roller in the wafer handoff and drying position.

18. A method for semiconductor wafer electroless plating as recited in claim 17, further comprising:
   performing a drying process on the wafer while the wafer is held in wafer handoff and drying position within the upper region of the chamber volume.

19. A method for semiconductor wafer electroless plating as recited in claim 18, wherein the drying process is performed on a top surface of the wafer by scanning an upper proximity head over the top surface of the wafer so as to subject the top surface of the wafer to a first dynamic liquid meniscus, and wherein the drying process is performed on a bottom surface of the wafer by scanning a lower proximity head over the bottom surface of the wafer so as to subject the bottom surface of the wafer to a second dynamic liquid meniscus.

20. A method for semiconductor wafer electroless plating as recited in claim 19, further comprising:
   maintaining the upper proximity head at a position directly above the lower proximity head during the drying process.

* * * * *